United States Patent
Ikeda et al.

(10) Patent No.: US 11,201,258 B2
(45) Date of Patent: Dec. 14, 2021

(54) METHOD FOR MANUFACTURING LIGHT EMITTING DEVICE

(71) Applicant: NICHIA CORPORATION, Anan (JP)

(72) Inventors: Tadaaki Ikeda, Anan (JP); Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 207 days.

(21) Appl. No.: 16/684,011

(22) Filed: Nov. 14, 2019

(65) Prior Publication Data

US 2020/0161498 A1     May 21, 2020

(30) Foreign Application Priority Data

Nov. 15, 2018  (JP) .............................. JP2018-214461
Sep. 30, 2019  (JP) .............................. JP2019-179303

(51) Int. Cl.
| | | |
|---|---|---|
| *G01R 31/26* | (2020.01) | |
| *H01L 21/66* | (2006.01) | |
| *H01L 21/00* | (2006.01) | |
| *H01L 33/00* | (2010.01) | |
| *H01L 25/075* | (2006.01) | |

(Continued)

(52) U.S. Cl.
CPC ...... *H01L 33/0095* (2013.01); *H01L 25/0753* (2013.01); *H01L 33/60* (2013.01); *H01L 33/62* (2013.01); *H01L 2933/0058* (2013.01)

(58) Field of Classification Search
CPC . H01L 33/0095; H01L 25/0753; H01L 33/60; H01L 33/62; H01L 2933/0058; H01L 2933/005; H01L 2933/0041; H01L 33/56; H01L 33/005; H01L 33/36; H01L 33/10
See application file for complete search history.

(56) References Cited

U.S. PATENT DOCUMENTS

| | | |
|---|---|---|
| 9,472,726 B2 | 10/2016 | Huang et al. |
| 2014/0319567 A1 | 10/2014 | Yoneda et al. |

(Continued)

FOREIGN PATENT DOCUMENTS

| | | |
|---|---|---|
| JP | 2012-124191 A | 6/2012 |
| JP | 2014-225644 A | 12/2014 |

(Continued)

*Primary Examiner* — Ismail A Muse
(74) *Attorney, Agent, or Firm* — Foley & Lardner LLP

(57) ABSTRACT

A method for manufacturing a light emitting device includes: providing an intermediate structure including first and second layered structures arranged in a first direction in a light reflecting member, wherein each of the layered structures includes a first and second electrodes arranged in a second direction, and wherein the intermediate structure has a first surface at which the first and second electrodes are exposed; on the first surface, forming a first hole in the light reflecting member between the first electrodes as viewed in the second direction; on the first surface, forming a second hole in the light reflecting member between the second electrodes as viewed in the second direction; forming a conductive film on exposed surfaces of the first and second electrodes, and in the first and second holes; and severing the light reflecting member and the conductive film at positions that pass through the first and second holes.

20 Claims, 16 Drawing Sheets

(51) Int. Cl.
*H01L 33/60* (2010.01)
*H01L 33/62* (2010.01)

(56) References Cited

U.S. PATENT DOCUMENTS

| | | | |
|---|---|---|---|
| 2015/0132949 A1* | 5/2015 | Lin | H01L 23/5389 438/667 |
| 2015/0207042 A1 | 7/2015 | Yoneda et al. | |
| 2015/0295152 A1 | 10/2015 | Yoneda et al. | |
| 2016/0013358 A1 | 1/2016 | Ting et al. | |
| 2016/0104682 A1* | 4/2016 | Winter | H01L 23/585 257/620 |
| 2016/0379957 A1* | 12/2016 | Ahn | H01L 23/49838 257/737 |
| 2017/0040512 A1 | 2/2017 | Tani et al. | |
| 2017/0179344 A1 | 6/2017 | Matsuda | |
| 2018/0005955 A1* | 1/2018 | Hsieh | H01L 23/3114 |
| 2018/0090648 A1 | 3/2018 | Yuu | |
| 2018/0159004 A1 | 6/2018 | Lai et al. | |
| 2019/0131249 A1* | 5/2019 | Hsieh | H01L 21/568 |
| 2019/0164783 A1* | 5/2019 | Huang | H01L 24/24 |

FOREIGN PATENT DOCUMENTS

| | | |
|---|---|---|
| JP | 2015-008220 A | 1/2015 |
| JP | 2015-135904 A | 7/2015 |
| JP | 2015-165534 A | 9/2015 |
| JP | 2015-201605 A | 11/2015 |
| JP | 2016-021570 A | 2/2016 |
| JP | 2017-034145 A | 2/2017 |
| JP | 2017-118098 A | 6/2017 |
| JP | 2018-061027 A | 4/2018 |
| JP | 2018-093197 A | 6/2018 |
| WO | WO-2017/167792 A1 | 10/2017 |

* cited by examiner

METHOD FOR MANUFACTURING LIGHT EMITTING DEVICE

CROSS-REFERENCE TO RELATED APPLICATION

This application claims priority to Japanese Patent Application No. 2018-214461, filed on Nov. 15, 2018, and Japanese Patent Application No. 2019-179303, filed on Sep. 30, 2019, the disclosures of which are hereby incorporated by reference in their entireties.

BACKGROUND

The present disclosure relates to a method for manufacturing a light emitting device.

Japanese Patent Publication No. 2012-124191 discloses a side view type light emitting device. The light emitting device of Japanese Patent Publication No. 2012-124191 includes a wiring board on the back surface side, and thus, the thickness between the light-emitting surface and the back surface tends to be large.

SUMMARY

A method for manufacturing a light emitting device according to one embodiment of the present disclosure includes steps of: providing an intermediate structure including a plurality of layered structures arranged in a first direction in a light reflecting member, the plurality of layered structures including a first layered structure and a second layered structure adjacent to the first layered structure, wherein the layered structures each include a first electrode and a second electrode arranged in this order in a second direction orthogonal to the first direction, a semiconductor layered structure connected to the first electrode and the second electrode, and a light transmissive member arranged on or above the semiconductor layered structure, and wherein the intermediate structure has a first surface at which the first electrode and the second electrode are exposed from the light reflecting member; on the first surface, forming a first hole in the light reflecting member between the first electrode of the first layered structure and the first electrode of the second layered structure as viewed in the second direction; on the first surface, forming a second hole in the light reflecting member between the second electrode of the first layered structure and the second electrode of the second layered structure as viewed in the second direction; forming a conductive film on exposed surfaces, on the first surface, of the first electrode and the second electrode of the first layered structure and the second layered structure, and in the first hole and the second hole; and severing the light reflecting member and the conductive film at positions that pass through the first hole and the second hole.

According to an embodiment of the present disclosure, it is possible to provide a method for manufacturing a small light emitting device.

DETAILED DESCRIPTION

A method for manufacturing a light emitting device according to an embodiment, a configuration of a manufactured light emitting device, and a configuration of a light source device having the light emitting device will be described in turn below. Note that the figures referred to below are schematic, and elements are emphasized or omitted therein as necessary. Dimensional ratios between elements are not always consistent between different figures. In the present disclosure, the terms "perpendicular" and "orthogonal" encompass cases in which two straight lines, sides, planes, etc., are in the range of about 90±3°, unless otherwise specified. In the present disclosure, the term "parallel" encompasses cases in which two straight lines, sides, planes, etc., are in the range of about 0±3°, unless otherwise specified.

A method for manufacturing a light emitting device according to the present embodiment includes steps of: providing an intermediate structure; forming a first hole and a second hole; forming a conductive film; and obtaining a plurality of light emitting devices.

Figure 1A:
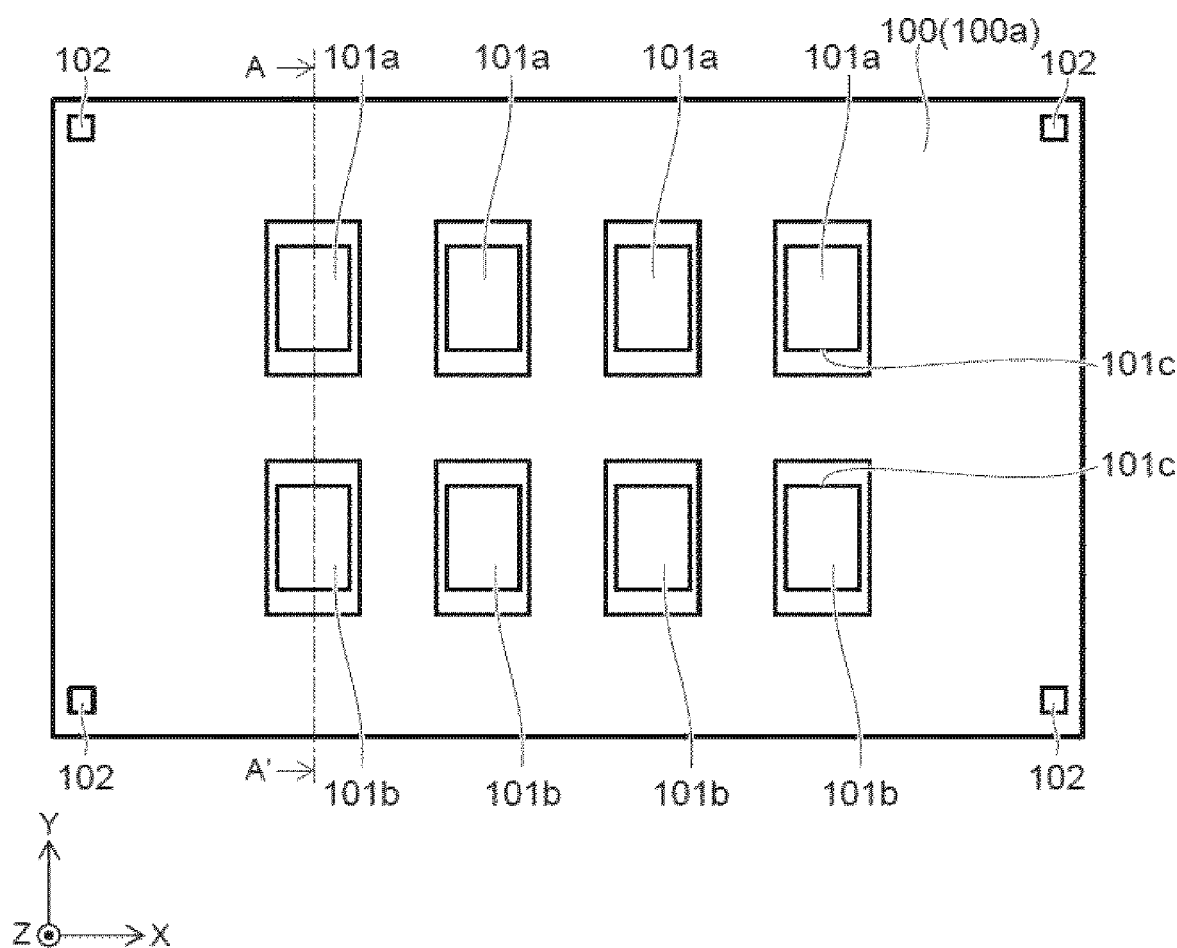
FIG. 1A is a schematic plan view showing a method for manufacturing a light emitting device according to an embodiment.
Figure 1B:
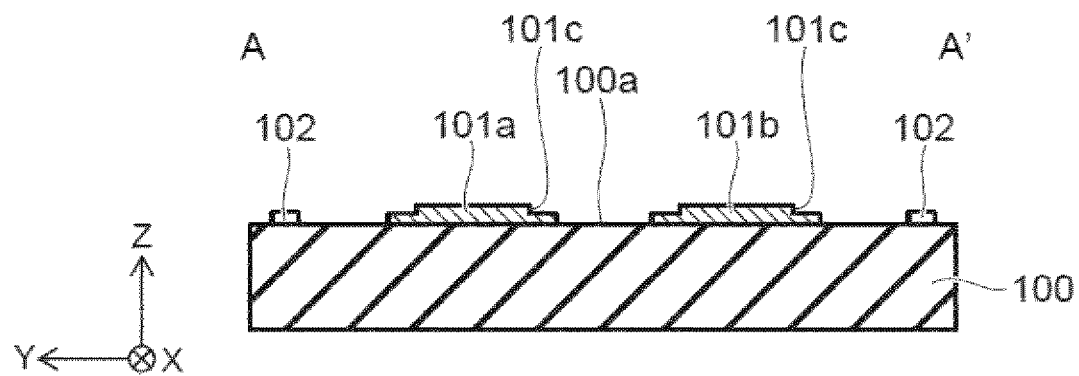
FIG. 1B is a schematic cross-sectional view taken along line A-A' shown in FIG. 1A.
Figure 8A:
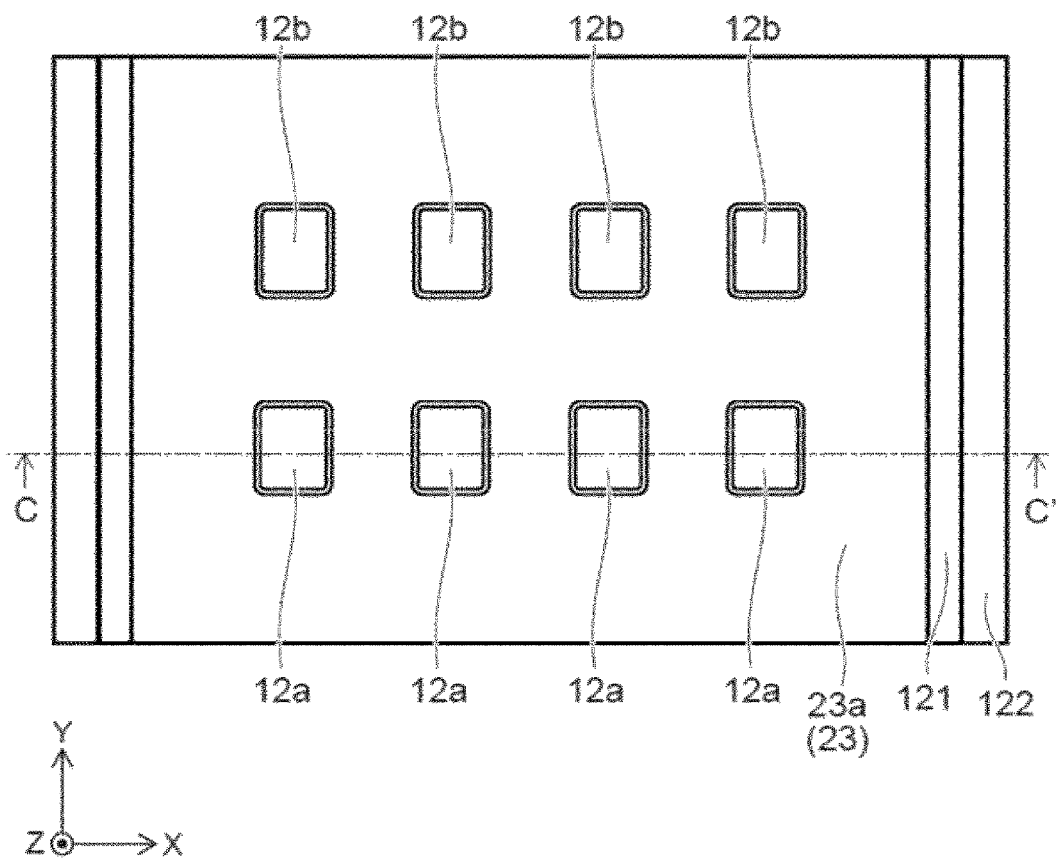
FIG. 8A is a schematic plan view showing a method for manufacturing a light emitting device according to an embodiment.
Figure 8B:
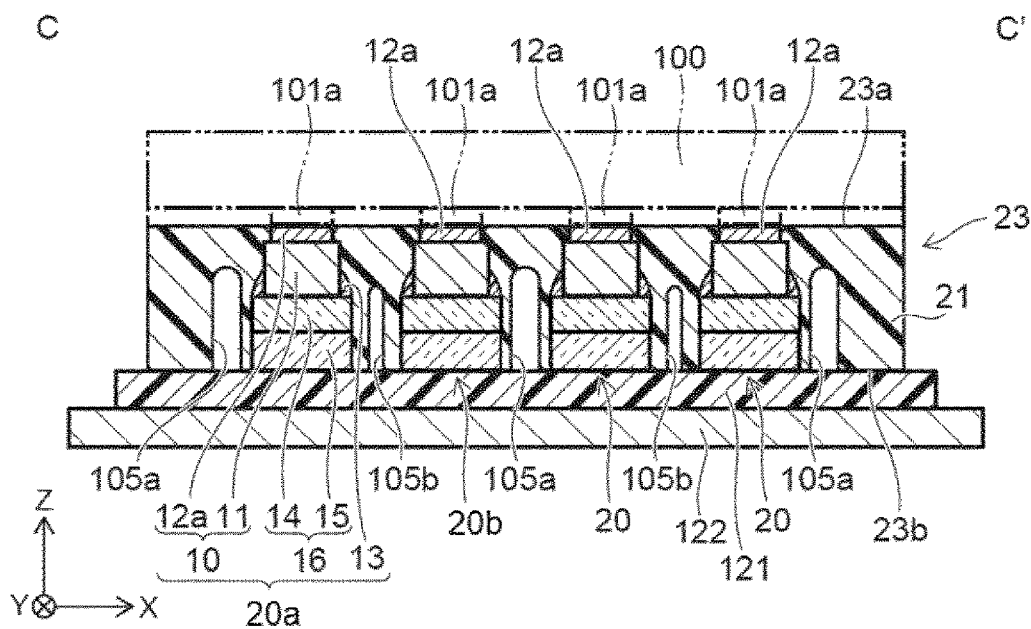
FIG. 8B is a schematic cross-sectional view taken along line C-C' shown in FIG. 8A.
Figure 9A:
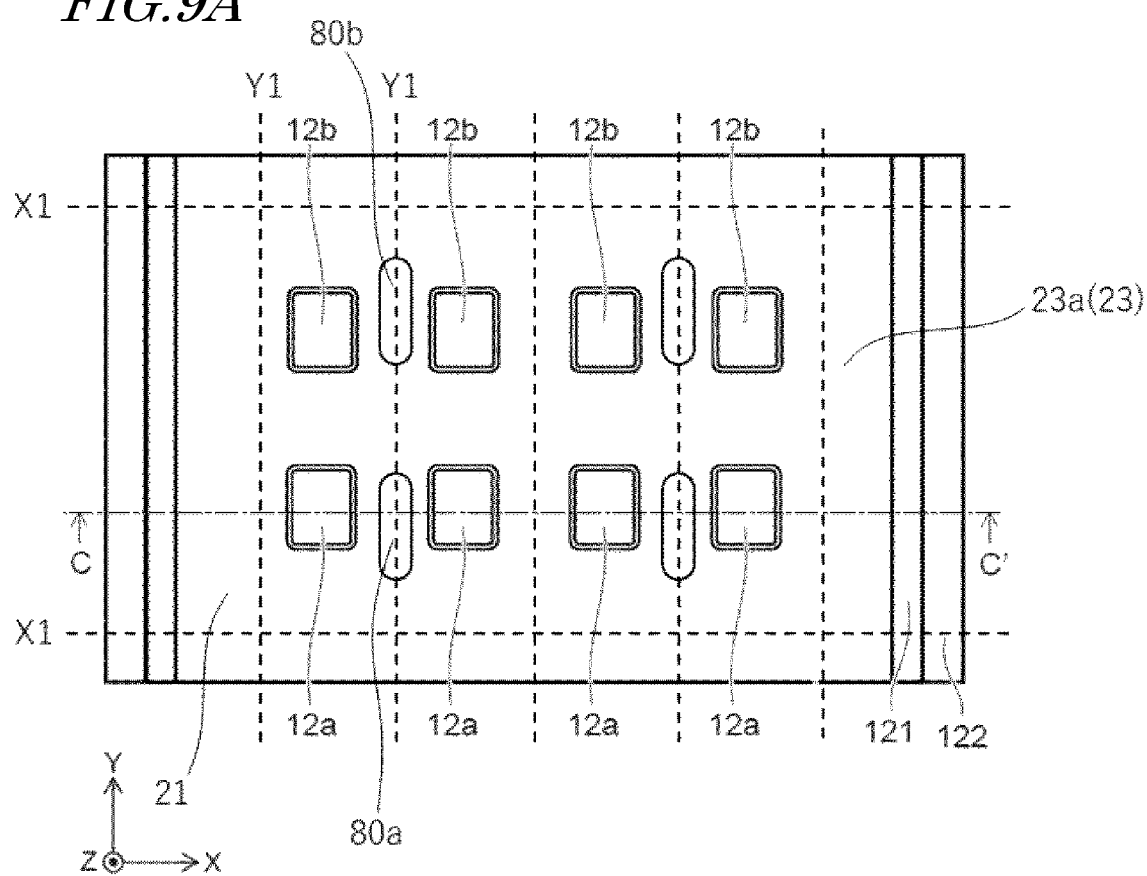
FIG. 9A is a schematic plan view showing a method for manufacturing a light emitting device according to an embodiment.

FIG. 1A to FIG. 11B are views illustrating a method for manufacturing a light emitting device according to the present embodiment. FIG. 1A, FIG. 2A, FIG. 3A to FIG. 11A are plan views, and FIG. 1B, FIG. 2B, FIG. 3B to FIG. 11B are cross-sectional views or end views corresponding to the plan views. FIG. 1B is a cross-sectional view taken along line A-A' shown in FIG. 1A, showing the same step as FIG. 1A. This similarly applies also to FIG. 2B to FIG. 4B. FIG. 5B is a cross-sectional view taken along line B-B' shown in FIG. 5A, showing the same step as FIG. 5A. This similarly applies also to FIG. 6B and FIG. 7B. FIG. 8B is a cross-sectional view taken along line C-C' shown in FIG. 8A, showing the same step as FIG. 8A. FIG. 9B to FIG. 11B each show an end view. Similar to FIG. 9A, FIG. 9C schematically shows a plan view.

(Step of Providing Intermediate Structure)

First, an intermediate structure 23 is prepared. As shown in, e.g., FIGS. 5A and 5B, the intermediate structure 23 includes a light reflecting member 21 and a plurality of layered structures 20 in a light reflecting member 21. The plurality of layered structures 20 are arranged in the first direction (i.e., X direction in FIG. 5A), wherein the layered structures 20 include at least one first layered structure 20a and at least one second layered structure 20b adjacent to the first layered structure 20a. Each layered structure 20 includes a first electrode 12a and a second electrode 12b arranged in the second direction orthogonal to the first direction (see, e.g., FIGS. 8A and 8B), a semiconductor layered structure 11 connected to the first electrode 12a and the second electrode 12b, and a light transmissive member 16 arranged on or above the semiconductor layered structure 11. The intermediate structure 23 has a first surface 23a on which the first electrode 12a and the second electrode 12b are exposed from the light reflecting member 21. The step of providing the intermediate structure 23 may be performed by manufacturing the intermediate structure 23 by an example manufacturing process to be described below, or may be performed by purchasing the intermediate structure 23. Hereinbelow, an example of a case where the intermediate structure 23 is prepared by being manufactured will be described.

First, a substrate 100 is prepared as shown in FIG. 1A and FIG. 13. The substrate 100 includes an insulative base having an upper surface 100a, a plurality of metal layers 101a and a plurality of metal layers 101b. The metal layers 101a and the metal layers 101b are arranged in, for example, a matrix pattern on the upper surface 100a. Note that while the present embodiment shows an example where only four pairs of metal layers 101a and 101b are provided on the insulative base for simplifying the figure, there is no limitation thereto and more metal layers 101a and 101b may be provided.

An XYZ Cartesian coordinate system is employed herein for the sake of illustration. The "X direction" (the first direction) denotes the direction in which the metal layers 101a are arranged and the direction in which the metal layers 101b are arranged, the "Y direction" (the second direction) denotes the direction in which the metal layer 101a and the metal layer 101b in each pair are arranged, and the "Z direction" (the third direction) denotes the direction that is orthogonal to the X direction and the Y direction, i.e., that is perpendicular to the upper surface 100a.

As shown in FIG. 13, each metal layer 101a may include a protruding portion 101c protruding in the Z direction. Similarly, each metal layer 101b may include a protruding portion 101c. Each of the protruding portions 101c is located in an area that opposes the electrode of a light emitting element 10 to be described below. It is preferred that the planar shape of the upper surface of the protruding portion 101c is substantially the same as the planar shape of the corresponding electrode of the light emitting element 10. Thus, when the light emitting element 10 is arranged on a pair of protruding portions 101c with a bonding member 103 therebetween, the light emitting element 10 is effectively self-aligned, thereby improving the mounting precision of the light emitting element 10. For example, the upper surface of the protruding portion 101c and the planar shape of the electrode of the light emitting element 10 may be rectangular shapes of which each corresponding side has substantially the same length (the tolerance is ±5% or less, and preferably ±3% or less).

As will be described below, the substrate 100 is removed when the light emitting device 1 is obtained. The maximum thickness of the substrate 100 is 100 µm or more and 500 µm or less, for example, and preferably 200 µm or more and 300 µm or less. With this configuration, it is possible to make easier the step of removing the substrate 100 while maintaining the strength of the substrate 100. The base material of the insulative base may be a fiberglass-reinforced plastic, for example. The fiberglass-reinforced plastic may preferably contain a BT resin whose coefficient of linear thermal expansion is 3 ppm/° C. to 10 ppm/° C., for example. A material having a high melting point such as an AuSn alloy may be used as the bonding member 103. The fiberglass-reinforced plastic may be an FR4 whose coefficient of linear thermal expansion is 14 ppm/° C. to 15 ppm/° C. In this case, by using a solder having a low melting point or the like as the bonding member 103, it is possible to improve the reliability of the substrate 100. The mass percentage of the glass fiber included in the base material may be 30 wt % to 70 wt %, for example, and preferably 40 wt % to 60 wt %. With such a configuration, it is possible to easily perform the step of removing the substrate 100.

The metal layers 101a and the metal layers 101b may be formed of copper, copper alloy, or the like, for example. The metal layers 101a and the metal layers 101b may include a nickel-phosphorus plating layer, a palladium plating layer, a first gold plating layer and a second gold plating layer in this order. By providing these layers on a layer including copper or a copper alloy, it is possible to alleviate diffusion of a copper component, and it is further possible to alleviate corrosion, such as oxidation or sulfuration, on the surface of the metal layers 101a, or the like. With this configuration, for example, even when the substrate 100 is stored over a long period of time, it is possible to alleviate deterioration of the substrate 100.

The substrate 100 preferably includes fiducial markers 102 on the upper surface 100a side. The fiducial markers 102 are markings used for determining the positional relationship with the metal layers 101a and the metal layers 101b as viewed from the upper surface 100a side. The fiducial markers 102 are formed by a conductive material, for example. The fiducial markers 102 may each be a protruding portion, a depressed portion, or a combination of a protruding portion and a depressed portion of the substrate 100. There is no limitation on the positions and the number of the fiducial markers 102. The fiducial markers 102 may be arranged at positions that are not to be covered by the light reflecting member 21 in a later step.

The fiducial markers 102 can be formed at the same time with the step of forming the metal layers 101a and the metal layers 101b. By forming the fiducial markers 102 at the same time with the step of forming the metal layers 101a and the metal layers 101b, it is possible to improve the positional precision of the element placement step, or the like, to be described below that uses the fiducial markers 102 as points of reference. The fiducial markers 102 may each be a member that includes a nickel-phosphorus plating layer, a palladium plating layer, a first gold plating layer and a second gold plating layer in this order, on a layer of copper or a copper alloy, for example.

Figure 2A:
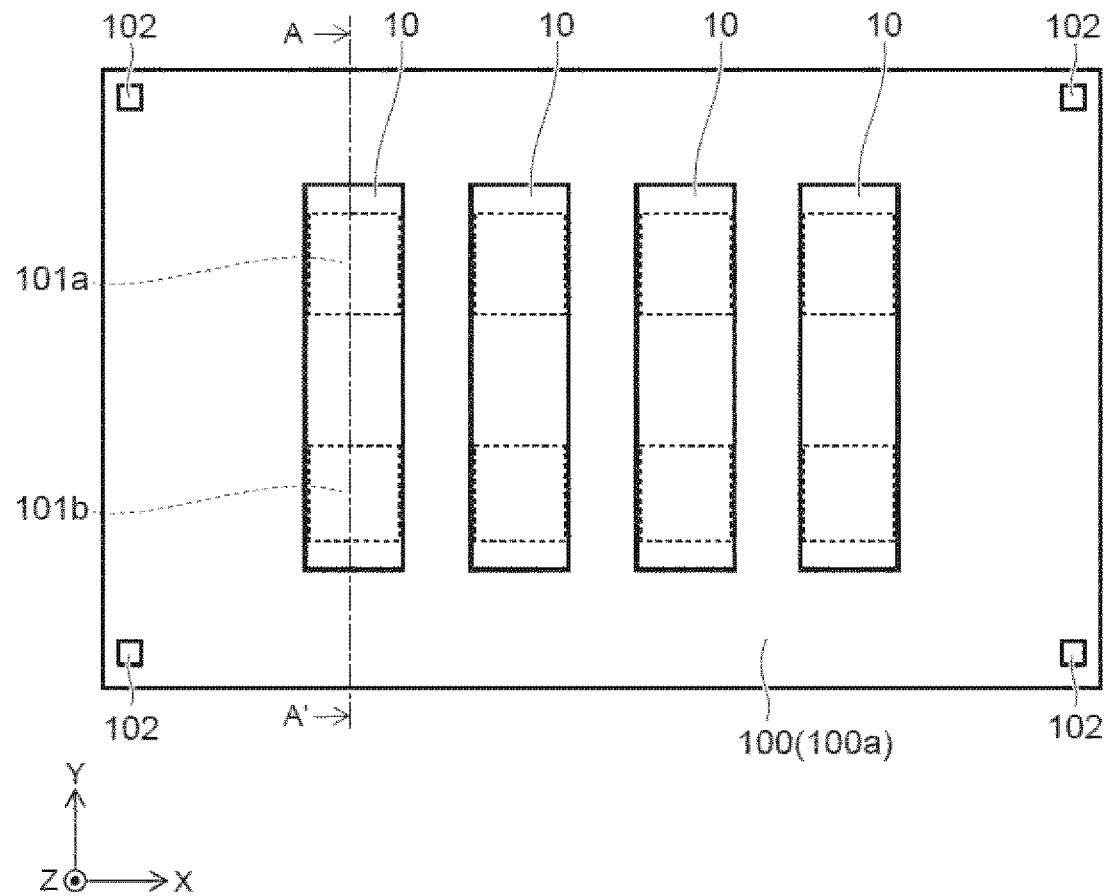
FIG. 2A is a schematic plan view showing a method for manufacturing a light emitting device according to an embodiment.
Figure 2B:
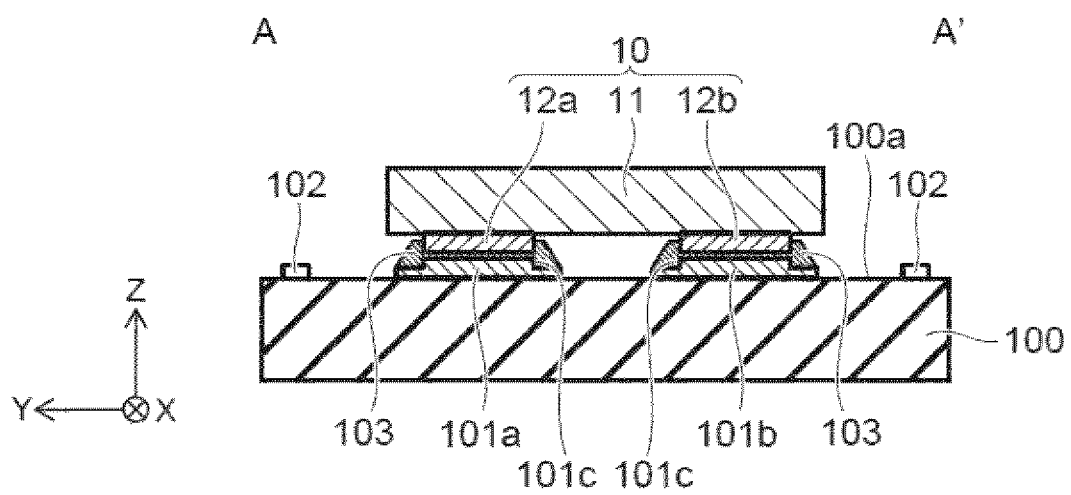
FIG. 2B is a schematic cross-sectional view taken along line A-A' shown in FIG. 2A.

Next, as shown in FIG. 2A and FIG. 2B, the bonding member 103 is provided on the metal layer 101a and on the metal layer 101b. The bonding member 103 is a solder, for example. Where the metal layer 101a and the metal layer 101b include the protruding portion 101c, the bonding member 103 is provided on the protruding portion 101c. Then, the light emitting element 10 is mounted on the substrate 100 using the fiducial markers 102 as a reference. The light emitting element 10 is mounted so that the lower surface of the first electrode 12a and the second electrode 12b opposes the upper surface of the metal layer 101a and the metal layer 101b of the substrate 100, respectively.

The light emitting element 10 is a light emitting diode (LED), for example. The light emitting element 10 includes the semiconductor layered structure 11, the first electrode 12a and the second electrode 12b. The light emitting element 10 may have a substrate for crystal growth on a surface of the semiconductor layered structure 11 that is opposite from the surface on which the first electrode 12a and the second electrode 12b are provided. The semiconductor layered structure 11 includes an n-type layer, a light emitting layer and a p-type layer layered together. One of the n-type layer and the p-type layer is connected to the first electrode 12a, and the other is connected to the second electrode 12b. The electrodes 12a and 12b are made of a metal material such as copper (Cu), for example. As the light emitting element 10 is mounted on the substrate 100, the first electrode 12a of the light emitting element 10 is connected to the metal layer 101a with the bonding member 103 therebetween, and the second electrode 12b is connected to the metal layer 101b with the bonding member 103 therebetween.

Figure 3A:
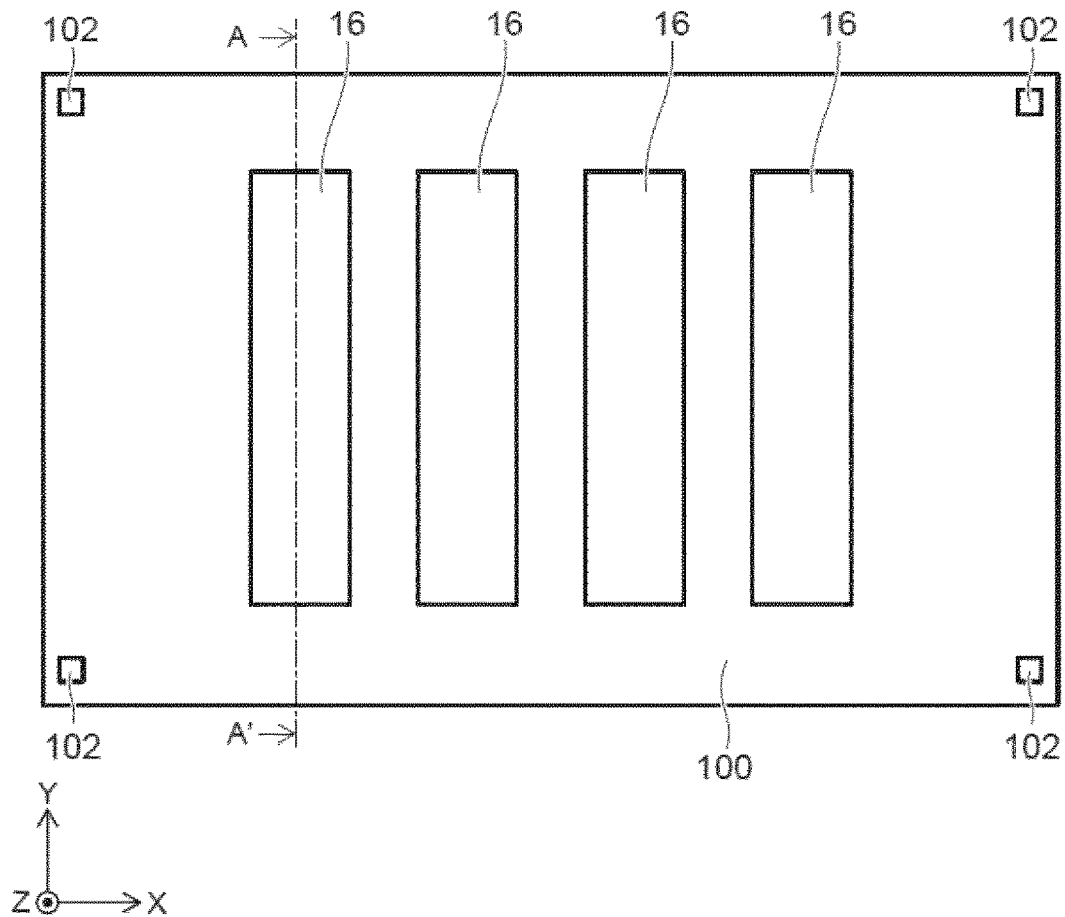
FIG. 3A is a schematic plan view showing a method for manufacturing a light emitting device according to an embodiment.
Figure 3B:
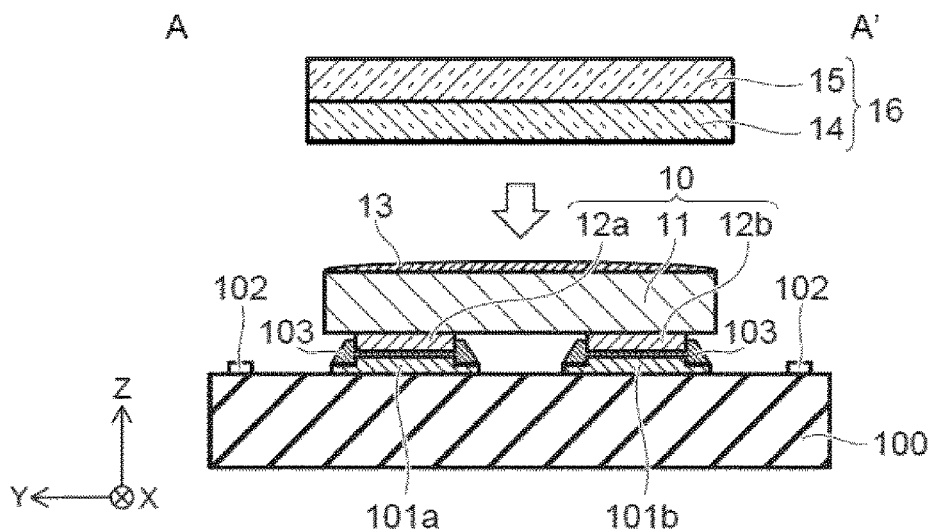
FIG. 3B is a schematic cross-sectional view taken along line A-A' shown in FIG. 3A.

Next, the light transmissive member 16 is prepared. The light transmissive member 16 is preferably a member including a phosphor layer 14 and a light transmissive layer 15 layered together as shown in FIG. 3A and FIG. 3B. The phosphor layer 14 contains a phosphor, and the light transmissive layer 15 does not substantially contain a phosphor. Herein, "not substantially containing a phosphor" does not exclude inevitable contamination with a phosphor. Note that the light transmissive member 16 may be only the phosphor layer 14 or only the light transmissive layer 15. The phosphor layer 14 may have a single-layer structure or a multi-layer structure. Similarly, the light transmissive layer 15 may have a single-layer structure or a multi-layer structure. Where the phosphor layer 14 has a multi-layer structure, it may include a layer containing a green phosphor that absorbs light from the light emitting element 10 and emits green light and a layer containing a red phosphor that absorbs light from the light emitting element 10 and emits red light. Where the phosphor layer 14 has a single-layer structure, it may contain a green phosphor and a red phosphor in the single layer.

Next, an adhesive layer 13 is arranged on the upper surface of the light emitting element 10, and the light emitting element 10 and the light transmissive member 16 are bonded together. Where the light transmissive member 16 includes the phosphor layer 14 and the light transmissive layer 15, the light transmissive member 16 is bonded to the upper surface of the light emitting element 10 in such an orientation that the phosphor layer 14 and an adhesive layer 13 are in contact with each other, for example. The adhesive layer 13 after the light transmissive member 16 is bonded (hereinafter referred to as a lightguide member 13) preferably covers the side surface of the light emitting element 10 in addition to the upper surface of the light emitting element 10. With this configuration, it is possible to improve the joining strength between the light transmissive member 16 and the light emitting element 10. The lightguide member 13 preferably covers the light emitting layer of the light emitting element 10. With this configuration, it is possible to extract a portion of light that is emitted from the side surface of the light emitting element 10 to the outside of the light emitting element 10 through the lightguide member 13, and it is possible to prevent a portion of light that has reached the side surface of the light emitting element 10 from being reflected by the side surface to attenuate in the light emitting element 10.

The lightguide member 13 preferably have a high light transmittance. Therefore, the lightguide member 13 is preferably substantially free of an additive that reflects, absorbs or scatters light. Herein, "substantially free of an additive" does not exclude inevitable contamination with an additive. Note that the lightguide member 13 may contain light diffusing particles and/or a phosphor.

Figure 4A:
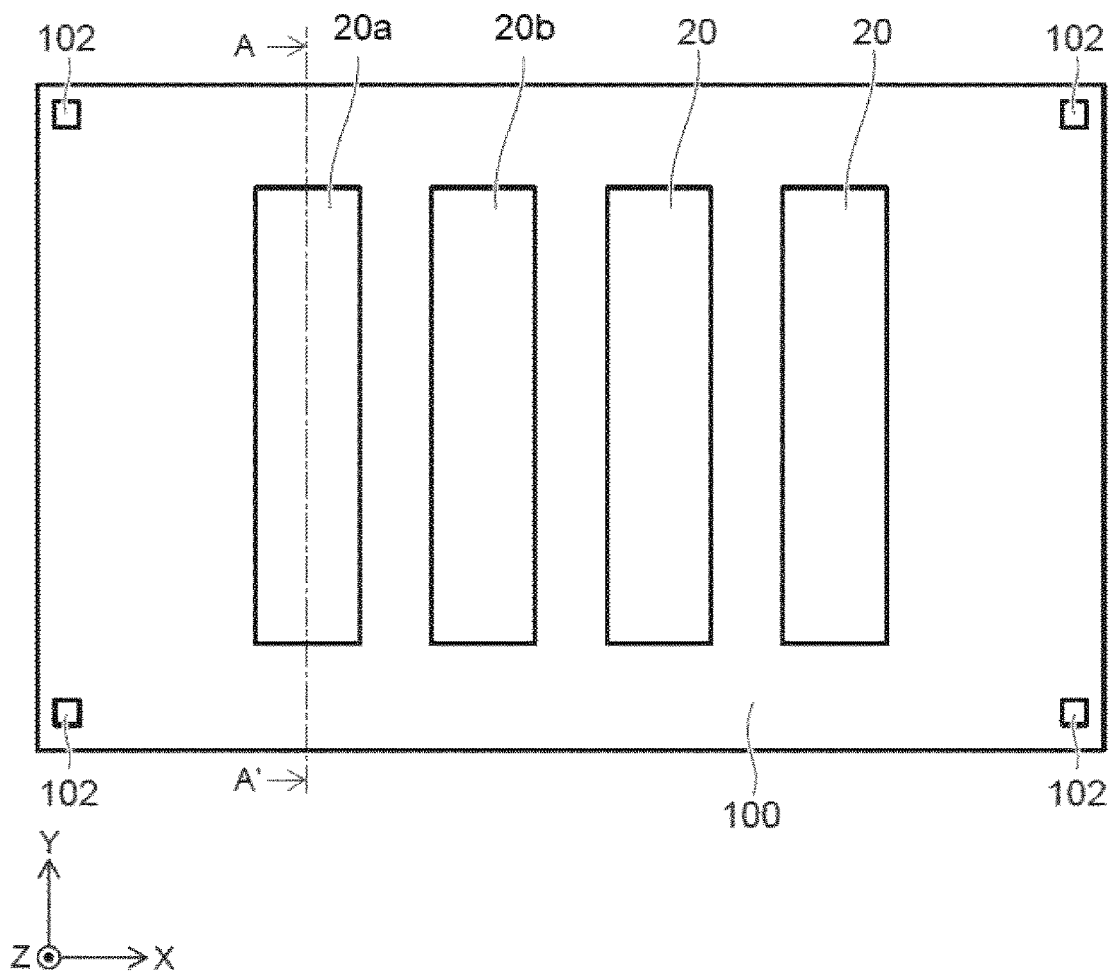
FIG. 4A is a schematic plan view showing a method for manufacturing a light emitting device according to an embodiment.
Figure 4B:
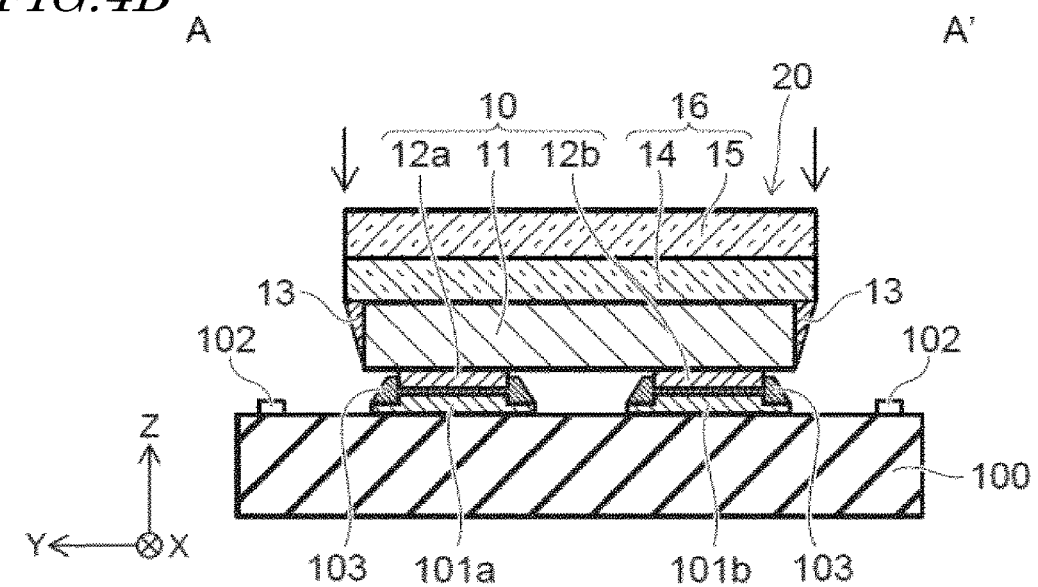
FIG. 4B is a schematic cross-sectional view taken along line A-A' shown in FIG. 4A.
Figure 5A:
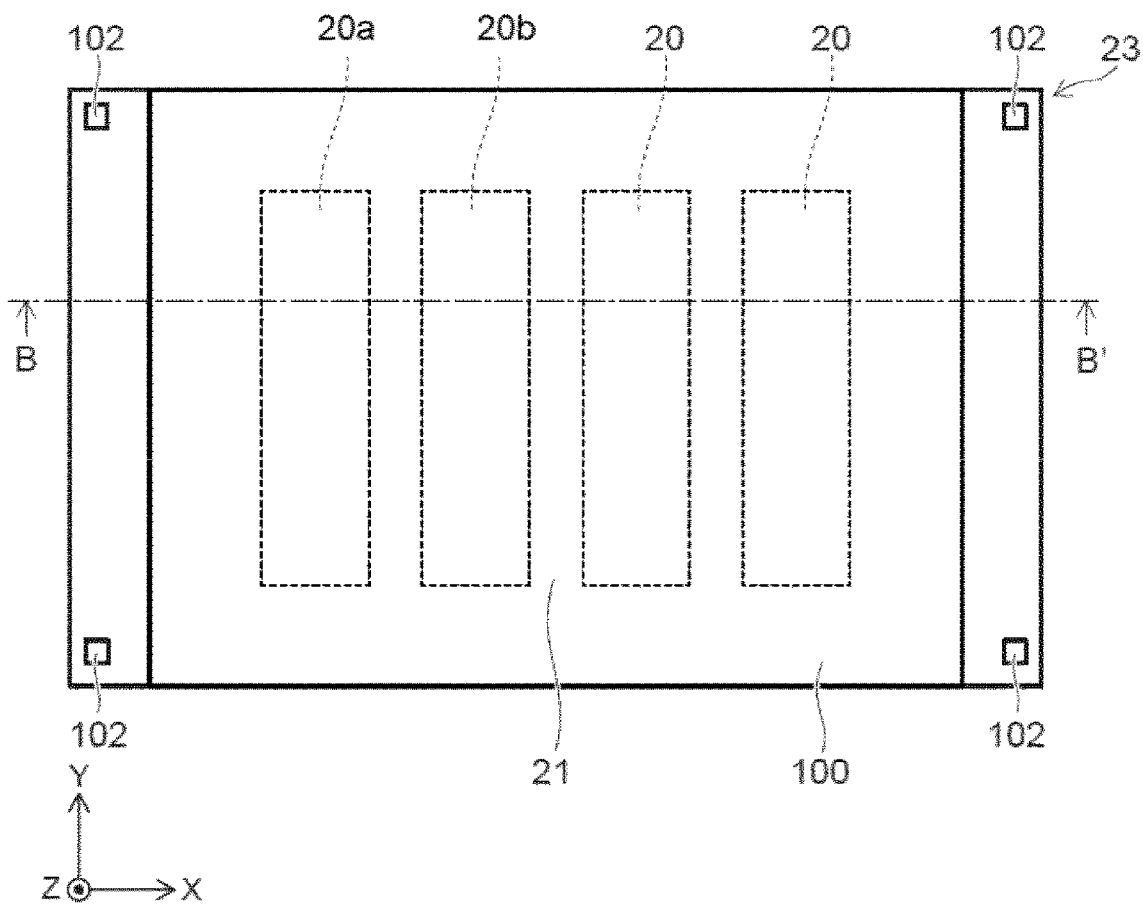
FIG. 5A is a schematic plan view showing a method for manufacturing a light emitting device according to an embodiment.
Figure 5B:
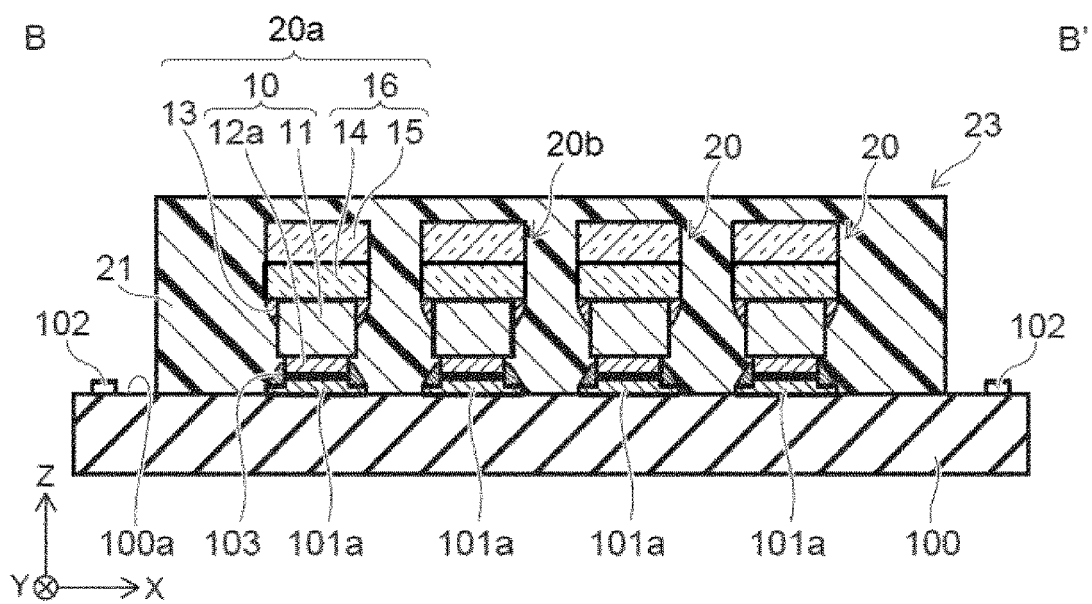
FIG. 5B is a schematic cross-sectional view taken along line B-B' shown in FIG. 5A.

Thus, a plurality of layered structures 20 are formed on the substrate 100, wherein each layered structure 20 includes the first electrode 12a and the second electrode 12b arranged in this order in the second direction (i.e., the negative Y direction), the semiconductor layered structure 11 that is connected to the first electrode 12a and the second electrode 12b, and the light transmissive member 16 arranged on or above the semiconductor layered structure 11 (see, FIG. 4A and FIG. 4B).

Next, the light reflecting member 21 is formed on the substrate 100 as shown in FIG. 5A and FIG. 5B. The light reflecting member 21 covers a pair of metal layers 101a and 101b, the bonding member 103 and the layered structure 20. The step of forming the light reflecting member 21 can be performed by, for example, arranging the substrate 100 with a plurality of layered structures 20 formed thereon in a mold, injecting a resin material to be the light reflecting member 21 into the mold, and curing the resin material. The light reflecting member 21 is preferably formed so as not to cover the fiducial markers 102. With this configuration, in the step of forming grooves such as first grooves 105 to be described below, it is possible to precisely form the grooves using the fiducial markers 102 as a reference.

The light reflecting member 21 is formed from a white resin, for example. Thus, the intermediate structure 23 including the light reflecting member 21 and a plurality of layered structures 20 is formed on the substrate 100. In the intermediate structure 23, a plurality of layered structures 20 are arranged in the first direction (the X direction), wherein the layered structures 20 include the first layered structure 20a and the second layered structure 20b adjacent to the first layered structure 20a in the light reflecting member 21.

Figure 6A:
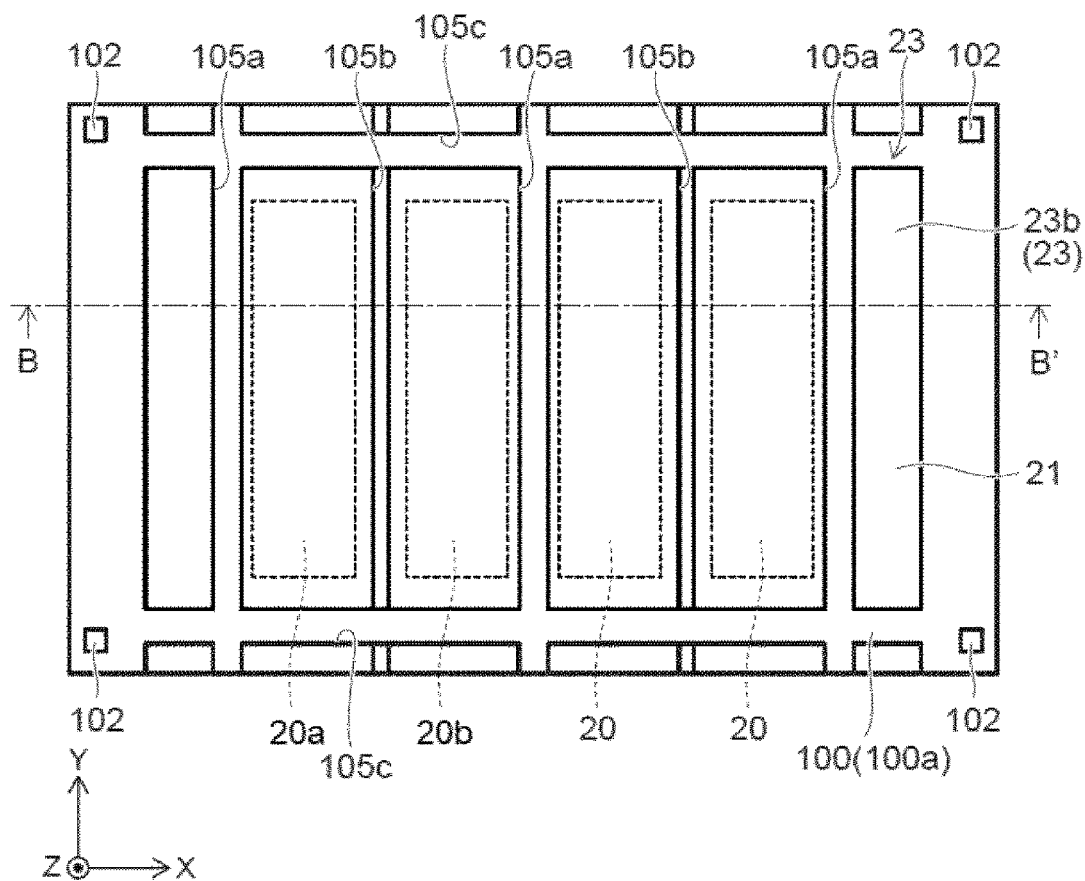
FIG. 6A is a schematic plan view showing a method for manufacturing a light emitting device according to an embodiment.
Figure 6B:
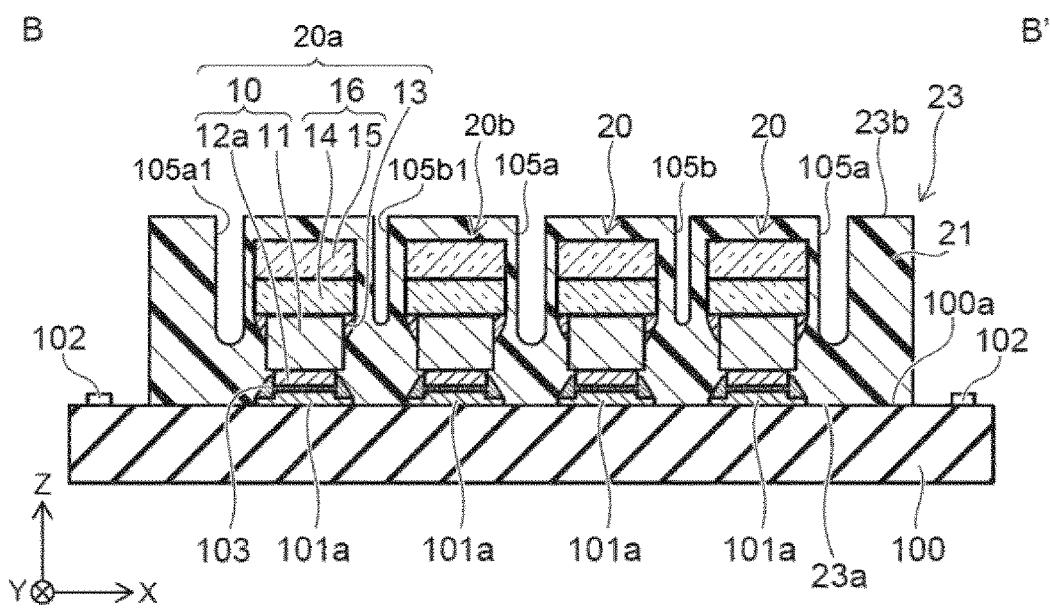
FIG. 6B is a schematic cross-sectional view taken along line B-B' shown in FIG. 6A.

In FIG. 6A and FIG. 6B, the lower surface of the intermediate structure 23 is the first surface 23a, and the upper surface thereof is a second surface 23b. The first surface 23a of the intermediate structure 23 is a surface that is opposite from the second surface 23b, and is opposing the upper surface 100a of the substrate 100. It is preferred to form grooves 105a and 105b extending in the second direction (the Y direction) and grooves 105c extending in the first direction (the X direction) on the second surface 23b of the intermediate structure 23, using the fiducial markers 102 as a reference, as shown in FIG. 6A and FIG. 6B. That is, it is preferred to form, using the fiducial markers 102 as a reference, the shape of the light emitting device 1 to be obtained on the light emitting surface side. In this manner, it is possible to precisely form the shape of the light emitting device 1 on the light emitting surface side.

In FIG. 6A, in the first direction (the X direction), the grooves 105a and the grooves 105b are arranged so as to alternate with each other. The grooves 105a are thicker and deeper than the grooves 105b. The grooves 105a and 105b will be referred to collectively as "first grooves 105". One first groove 105 is formed in the light reflecting member 21 in each space between layered structures 20. It is preferred that the first grooves 105 do not run through the intermediate structure 23 in the third direction (the Z direction). With this configuration, it is possible to alleviate the decrease in strength of the intermediate structure 23, making subsequent steps easier. The grooves 105c have the same width and the same depth as the grooves 105a, for example. The grooves 105a, the grooves 105b and the grooves 105c can be formed by dicing or by using laser, or the like. Note that the grooves 105a and the grooves 105b may have the same width and may have the same depth. In this case, the grooves 105a, 105b and 105c can be formed by using a single dicing blade, for example.

On the second surface 23b of the intermediate structure 23, the width of the grooves 105a is 0.2 times to 0.9 times, for example, and preferably 0.3 times to 0.75 times, the distance between layered structures 20 that are adjacent to each other in the first direction (the X direction). On the second surface 23b of the intermediate structure 23, the width of the grooves 105a is 25 µm or more and 200 µm or less, and preferably 50 µm or more and 100 µm or less.

On the second surface 23b of the intermediate structure 23, the width of the grooves 105b is 0.15 times to 0.5 time, for example, and preferably 0.2 times to 0.35 time, the distance between layered structures 20 that are adjacent to each other in the first direction (the X direction). On the second surface 23b of the intermediate structure 23, the width of the grooves 105b is 25 µm or more and 150 µm or less, preferably 40 µm or more and 80 µm or less.

On the second surface 23b of the intermediate structure 23, the width of the grooves 105c is 0.25 times to 0.65 times, for example, and preferably 0.3 times to 0.55 times, the distance between layered structures 20 that are adjacent to each other in the second direction (the Y direction). On the second surface 23b of the intermediate structure 23, the width of the grooves 105c is 25 µm or more and 200 µm or less, preferably 50 µm or more and 100 µm or less.

The bottom surfaces of the grooves 105a and the grooves 105b are preferably located on the lower side relative to the upper surfaces of the light emitting elements 10 in the third direction (the Z direction). Then, it is possible to realize an intended thickness of the light reflecting member 21 that is present between side surfaces 105a1 and 105b1 formed by the grooves 105a and the grooves 105b and the side surface of the light transmissive member 16. Thus, for example, the thickness of the light reflecting member 21 in said region can be set to a thickness such that it is possible to alleviate leakage, to the outside through the light reflecting member 21, of light exiting from the side surface of the light transmissive member 16. As a result, it is possible to provide a light emitting device having a good light extraction. The thickness of the light reflecting member 21 that is present between the side surfaces 105a1 and 105b1 formed by the grooves 105a and the grooves 105b and the side surface of the light transmissive member 16 is 15 µm to 50 µm, for example, and preferably 20 µm to 30 µm. The thickness of the light reflecting member 21 that is present between the side surfaces 105a1 and 105b1 formed by the grooves 105a and the grooves 105b and the side surface of the light transmissive member 16 is 3/40 times to 1/4 times, for example, and preferably 1/10 times to 3/20 times, the thickness of the light emitting element 10 in the first direction (the X direction).

The bottom surfaces of the grooves 105b are preferably located on the upper side relative to the bottom surfaces of the grooves 105a in the third direction (the Z direction). In the step of forming the first holes 80a and the second holes 80b to be described below, the first holes 80a and the second holes 80b are preferably formed so as not to run through the grooves 105b, and so as to oppose the grooves 105b. In such a case, by locating the bottom surfaces of the grooves 105b on the upper side relative to the bottom surfaces of the grooves 105a, the first holes 80a and the second holes 80b can be formed deep in the third direction (the Z direction). As a result, it is possible to ensure a large area in the first holes 80a and the second holes 80b where the conductive film 25 is formed. Thus, because the conductive film 25 located on a mounting surface of the light emitting device 1 to be obtained (which opposes the mounting substrate 51 when arranging the light emitting device 1 on the mounting substrate 51) has a large area, it is possible to improve the joining strength between the light emitting device 1 and the mounting substrate 51 when mounting the light emitting device 1 on a mounting substrate 51 with a bonding member 52 therebetween. Moreover, by locating the bottom surfaces of the grooves 105a on the lower side relative to the bottom surfaces of the grooves 105b, the thickness of the light reflecting member 21 that is present between the side surfaces 105a1 and 105b1 formed by the grooves 105a and the grooves 105b and the side surfaces of the layered structures 20 can be set to an intended thickness over a wide area. Thus, it is possible to alleviate leakage, to the outside through the light reflecting member 21, of light exiting to the outside through the side surface of the layered structure 20. Thus, for example, the thickness of the light reflecting member 21 in said region can be set to a thickness such that it is possible to alleviate leakage, to the outside through the light reflecting member 21, of light exiting from the side surface of the layered structure 20. Note that when the bottom surface of a groove is a curved surface, the entire curved surface is regarded as the bottom surface of the groove.

Figure 7A:
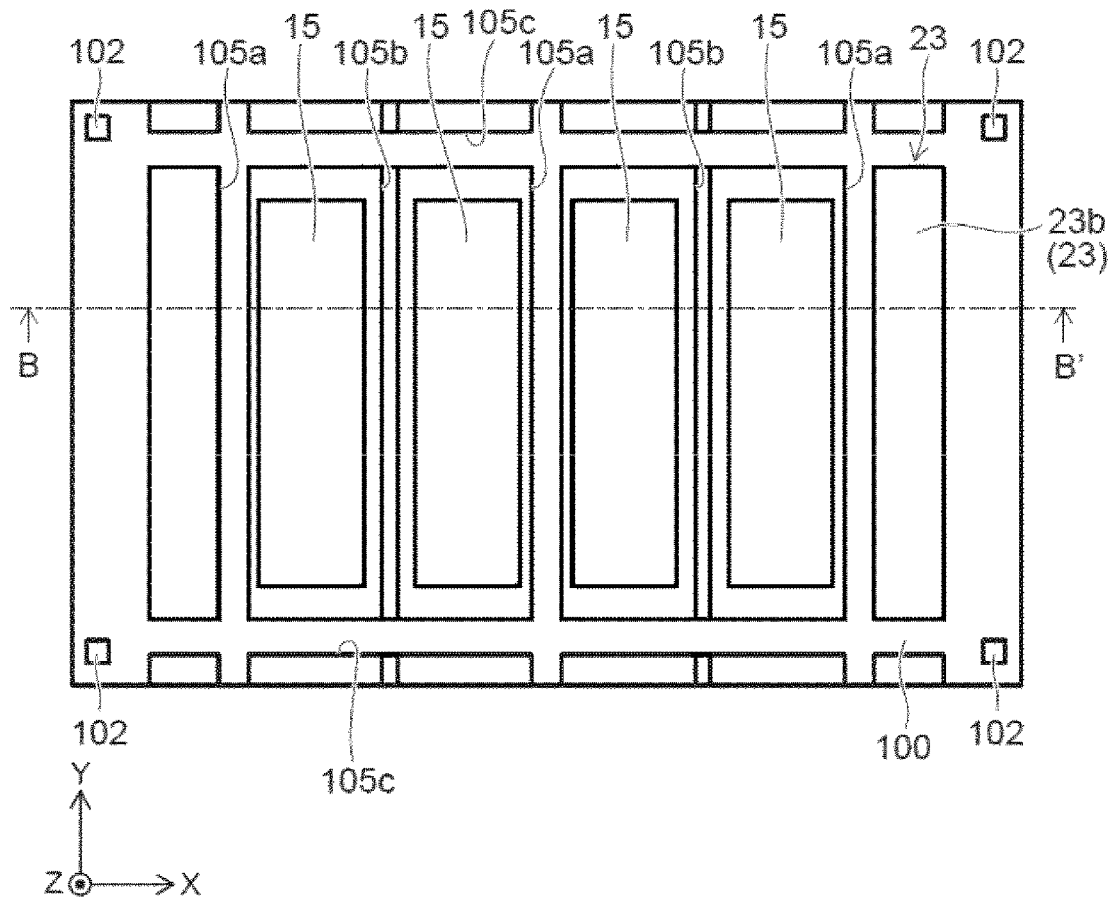
FIG. 7A is a schematic plan view showing a method for manufacturing a light emitting device according to an embodiment.
Figure 7B:
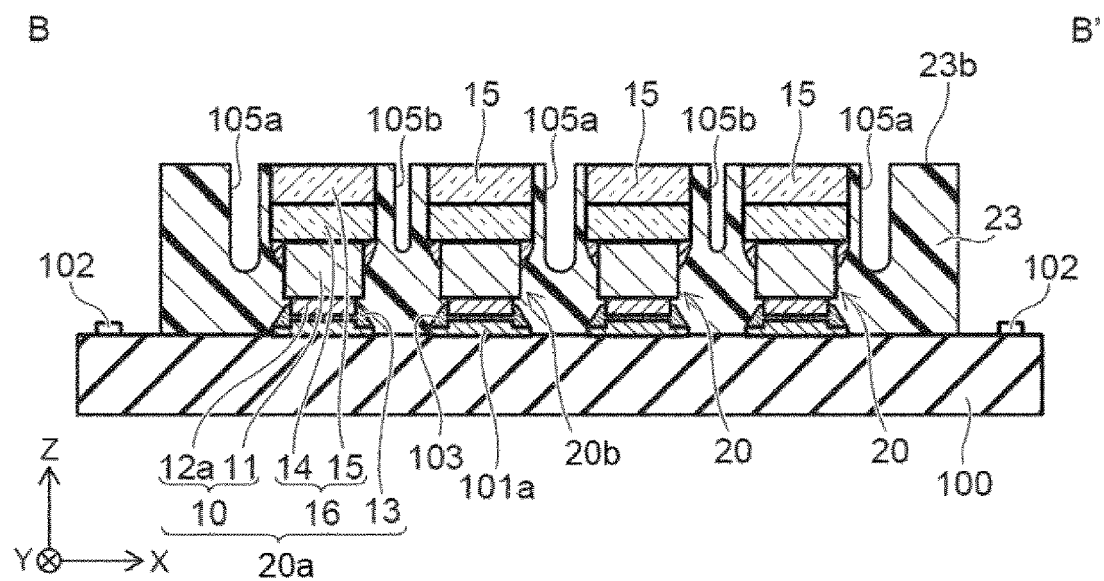
FIG. 7B is a schematic cross-sectional view taken along line B-B' shown in FIG.

Next, as shown in FIG. 7A and FIG. 7B, a portion of the light reflecting member 21 located on the second surface 23b side of the intermediate structure 23 is removed. Thus, the light transmissive layers 15 of the light transmissive members 16 are exposed on the newly-formed second surface 23b. The step of removing a portion of the light reflecting member 21 may remove, in addition to the light reflecting member 21 located on the second surface 23b, a portion of the light transmissive layer 15 of the light transmissive member 16 located under the light reflecting member 21. With the light transmissive layer 15 located over the phosphor layer 14, it is possible to reduce the possibility of inadvertently removing the phosphor layer 14 during the step of removing a portion of the light reflecting member 21. As the method for removing a portion of the light reflecting member 21, a known method such as grinding, etching, cutting, blasting, or the like may be used. Note that the step of removing the second surface 23b of the intermediate structure 23 may be performed before the step of forming the grooves 105a, the grooves 105b and the grooves 105c.

Next, as shown in FIG. 8A, the intermediate structure 23 is secured to a carrier 122. In this step, an adhesive sheet 121 is arranged between the carrier 122 and the second surface 23b of the intermediate structure 23, as shown in FIG. 8B. The carrier 122 is a silicon wafer or a metal substrate, for example. In the description hereinbelow, as compared with the description hereinbefore, the figures are inverted upside down. That is, the direction from the semiconductor layered structure 11 toward the light transmissive member 16 is the upward direction in FIG. 1A to FIG. 7B, whereas the direction from the light transmissive member 16 toward the semiconductor layered structure 11 is the upward direction in FIG. 8A to FIG. 11B, and the description hereinbelow will conform to this orientation.

Next, the substrate 100 is removed. By removing the substrate 100, it is possible to reduce the size of the light emitting device 1 manufactured in a subsequent step.

As the method for removing the substrate 100, a known method such as grinding, etching, cutting and blasting may be used. Particularly, grinding is preferably used as the method for removing the substrate 100. In the step of removing the substrate 100, for example, a grinder is used to grind the structure from above the substrate 100 and partially into the first electrode 12a and the second electrode 12b of the light emitting element 10. In the step of removing the substrate 100, a portion of the light reflecting member 21 and a portion of the bonding member 103 may be removed.

Then, the exposed surface of the light reflecting member 21, the exposed surface of the first electrode 12a and the second electrode 12b, and the exposed surface of the bonding member 103 can be made coplanar with each other, making the first surface 23a of the intermediate structure 23 flat. As a result, it is possible to alleviate variations in shape, etc., between a plurality of light emitting devices 1.

In the present embodiment, the intermediate structure 23 is completed by removing the substrate 100. The electrodes 12a and 12b are exposed on the first surface 23a of the intermediate structure 23. By removing the substrate 100, it is possible to reduce the thickness from the light emitting surface to the back surface of the light emitting device 1 to be obtained, thereby realizing a small light emitting device 1. Note that only a portion of the bonding member 103 may be removed, or the entirety thereof may be removed.

After the step of removing the substrate 100, it is preferred to perform a cleaning step. By performing the cleaning step, even if chips (i.e., machining swarf) of the substrate 100, etc., remain stuck on the surface of the intermediate structure 23, it is possible to effectively remove such chips. The cleaning step is performed by blowing a gas or a liquid, by blowing particles that sublime such as solid carbon dioxide, or by immersing the structure in a liquid, etc.

The description above is directed to an example in which the intermediate structure 23 is provided by being manufactured. Note that as described above, the step of providing the intermediate structure 23 may be performed by purchasing the intermediate structure 23 shown in FIG. 8A and FIG. 8B, for example.

(Step of Forming First Holes 80a and Second Holes 80b)

Figure 9B:
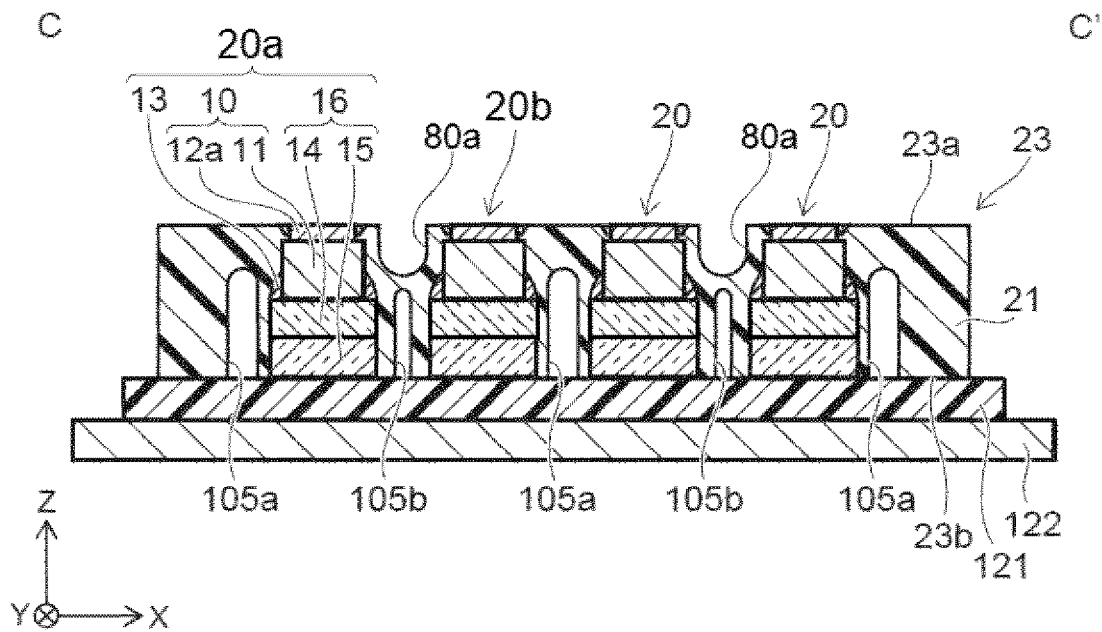
FIG. 9B is a schematic end view taken along line C-C' shown in FIG. 9A.
Figure 9C:
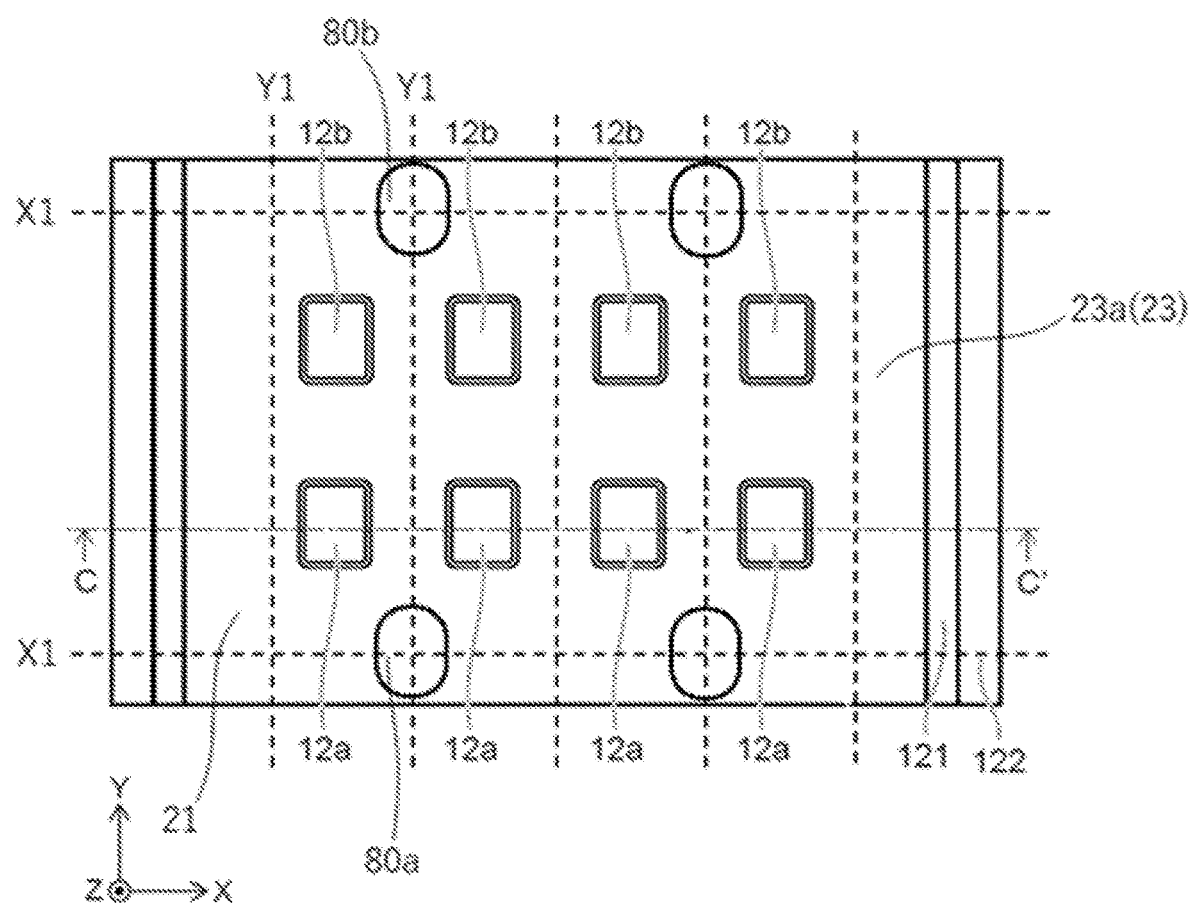
FIG. 9C is a schematic plan view showing another illustrative method for manufacturing a light emitting device according to an embodiment.

Next, as shown in FIG. 9A and FIG. 9B, on the first surface 23a of the intermediate structure 23, the first holes 80a are formed in the light reflecting member 21 each between the first electrode 12a of the first layered structure 20a and the first electrode 12a of the second layered structure 20b, and the second holes 80b are formed in the light reflecting member 21 each between the second electrode 12b of the first layered structure 20a and the second electrode 12b of the second layered structure 20b. The first holes 80a and the second holes 80b are formed in order to arrange the conductive film 25 (to be described below) on a surface to be the mounting surface of the light emitting device 1. Where the intermediate structure 23 has the first grooves 105, the first holes 80a and the second holes 80b are formed at positions that oppose the grooves 105b, for example. Note that as viewed from above, each first hole 80a may be formed so that the first hole 80a is entirely located between adjacent first electrodes 12a, or may be formed so that the first hole 80a is partially located between adjacent first electrodes 12a. This similarly applies also to the second holes 80b.

In FIG. 9A and FIG. 9B, the first holes 80a and the second holes 80b are formed so that they are open at the first surface 23a and they are not open at the second surface 23b on the opposite side from the first surface 23a. Where the intermediate structure 23 has the first grooves 105, it is preferred that the first holes 80a and the second holes 80b do not reach the grooves 105b. In this manner, it is possible to prevent the conductive film 25 from being formed inadvertently on the light emitting surface side. Note that, however, the first holes 80a and the second holes 80b may be formed so as to be open at the first surface 23a and the second surface 23b. With this configuration, the conductive film 25 can be formed over a wide area, and it is therefore possible to improve the joining strength between the light emitting device 1 and the mounting substrate 51 when arranging the light emitting device 1 on the mounting substrate 51 with a bonding member therebetween.

A pair of holes (the first hole 80a and the second hole 80b) may be arranged between adjacent layered structures 20. However, it is preferred that the first holes 80a and the second holes 80b are formed so as to oppose every other first groove 105. In the example shown in FIG. 9A and FIG. 9B, the first holes 80a and the second holes 80b are formed so as to oppose the grooves 105b and not oppose the grooves 105a. That is, a pair of holes are shared between two layered structures 20. Thus, as compared with a case where a pair of holes are formed for one layered structure 20, it is possible to shorten the distance between layered structures 20. In other words, it is possible to shorten the distance from one side to the other side of the intermediate structure 23 in the X direction. As a result, it is possible to increase the number of light emitting devices 1 to be obtained from one intermediate structure 23.

Only one first hole 80a or two or more first holes 80a may be formed between the first electrode 12a of the first layered structure 20a and the first electrode 12a of the second layered structure 20b. Only one second hole 80b or two or more second holes 80b may be formed between the first electrode 12a of the first layered structure 20a and the first electrode 12a of the second layered structure 20b. The provision of two or more first holes 80a and/or two or more second holes 80b improves the adhesion strength between the conductive film 25 to be described below and the intermediate structure 23.

A third hole between the first hole 80a and the second hole 80b may be formed between adjacent layered structures 20. The third hole is not located between adjacent first electrodes 12a or between adjacent second electrodes 12b. The conductive film 25 may be formed on the inner surface of the third hole, or the conductive film 25 may be absent on the inner surface.

The first holes 80a and the second holes 80b may each be formed so as to be open at the second severing line Y1 and not open at the first severing line X1 as shown in FIG. 9A. In other words, in the example shown in FIG. 9A, one of the pair of second severing lines passes through both of the first hole 80a and the second hole 80b, and the pair of first severing lines pass through neither of the first hole 80a and the second hole 80b. Then, a portion of a hole is not formed on a pair of side surfaces of the obtained light emitting device 1 that are perpendicular to the second direction (the Y direction). As a result, when mounting the light emitting device 1 on the mounting substrate 51 with a bonding member therebetween, for example, it is possible to prevent the bonding member from flowing to the outside from the pair of side surfaces of the light emitting device 1 that are perpendicular to the second direction (the Y direction). Thus, it is possible to reduce the mounting area of the light emitting device 1 including the bonding member.

Alternatively, the first holes 80a and the second holes 80b may each be formed so as to be open at a first severing line X1 and a second severing line Y1 as shown in FIG. 9C. In the example shown in FIG. 9C, one of the pair of first severing lines passes through the first hole 80a and another of the pair of first severing lines passes through the second hole 80b, and one of the pair of second severing lines passes through both of the first hole 80a and the second hole 80b.

The first severing line X1 is a severing line that is parallel to the first direction (the X direction), and the second severing line Y1 is a severing line that is parallel to the second direction (the Y direction). The light emitting device 1 is obtained by severing the structure along a pair of first severing lines X1 and a pair of second severing lines Y1. At least one of the pair of second severing lines Y1 is set so as to pass through the first hole 80a and the second hole 80b. By forming the first holes 80a and the second holes 80b so as to be open at the first severing line X1 and the second severing line Y1, it is possible to form the conductive film 25 having a large width on the mounting surface of the light emitting device 1. This improves the heat dissipation on the mounting surface side of the light emitting device 1. When the light emitting device 1 is arranged on the mounting substrate 51, the contact area between the bonding member and the light emitting device 1 increases, thereby improving the joining strength between the light emitting device 1 and the mounting substrate 51.

In the second direction (the Y direction), the length of the first hole 80a and the second hole 80b is preferably longer than the length of the first electrode 12a and the second electrode 12b, respectively. With this configuration, in the process of mounting the light emitting device 1 on the mounting substrate using a bonding member such as a solder, it is possible to reduce the possibility of a tombstone phenomenon or the possibility of the light emitting device 1 being arranged with a light exit surface 30a of the light emitting device 1 being slanted.

The width of the first hole 80a and the second hole 80b is 0.45 times to 0.6 times, for example, and preferably 0.5 times to 0.55 times, the distance between adjacent first electrodes 12a in the first direction (the X direction). The width of the first hole 80a and the second hole 80b is 100 µm or more and 180 µm or less, and preferably 120 µm or more and 160 µm or less, on the first surface 23a of the intermediate structure 23. The width of the first hole 80a and the second hole 80b can be made larger than the width of the groove 105a and the groove 105b. Then, it is possible to increase the volume of the conductive film 25 to be formed in the first holes 80a and the second holes 80b and improve the heat dissipation of the obtained light emitting device 1.

(Step of Forming Conductive Film 25)

Figure 10A:
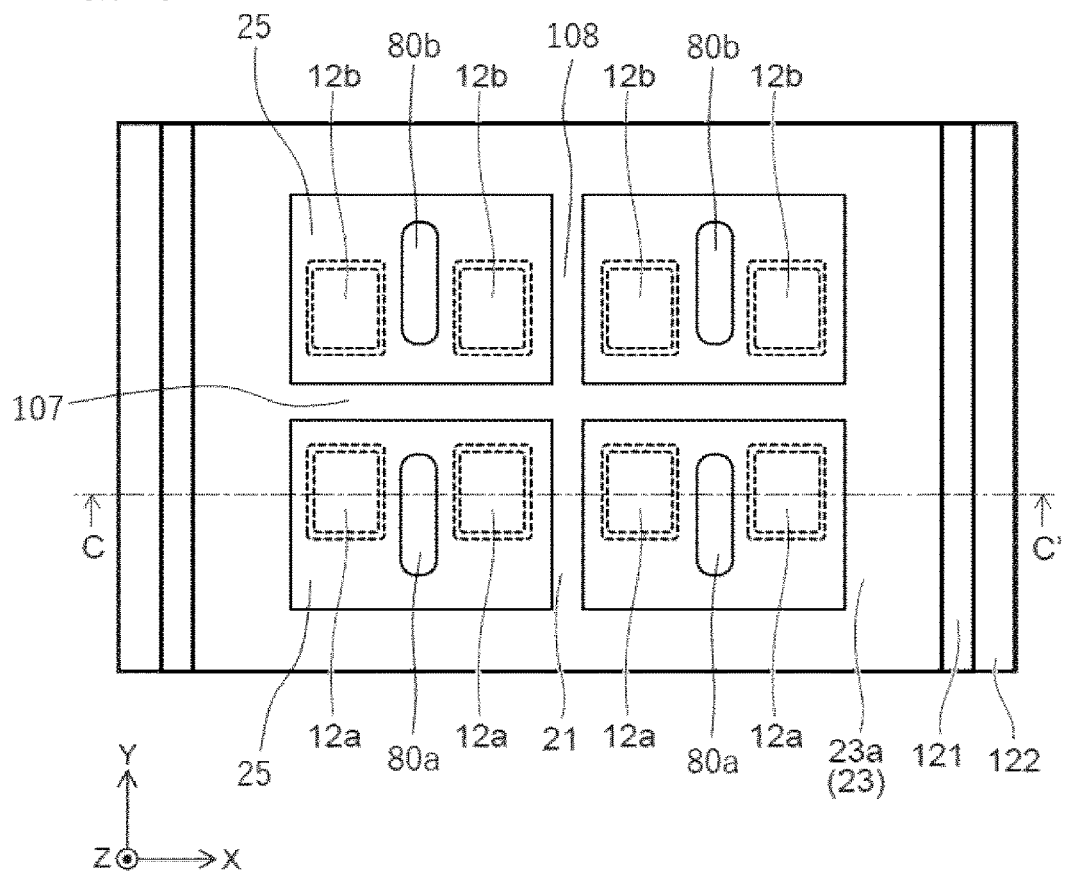
FIG. 10A is a schematic plan view showing a method for manufacturing a light emitting device according to an embodiment.
Figure 10B:
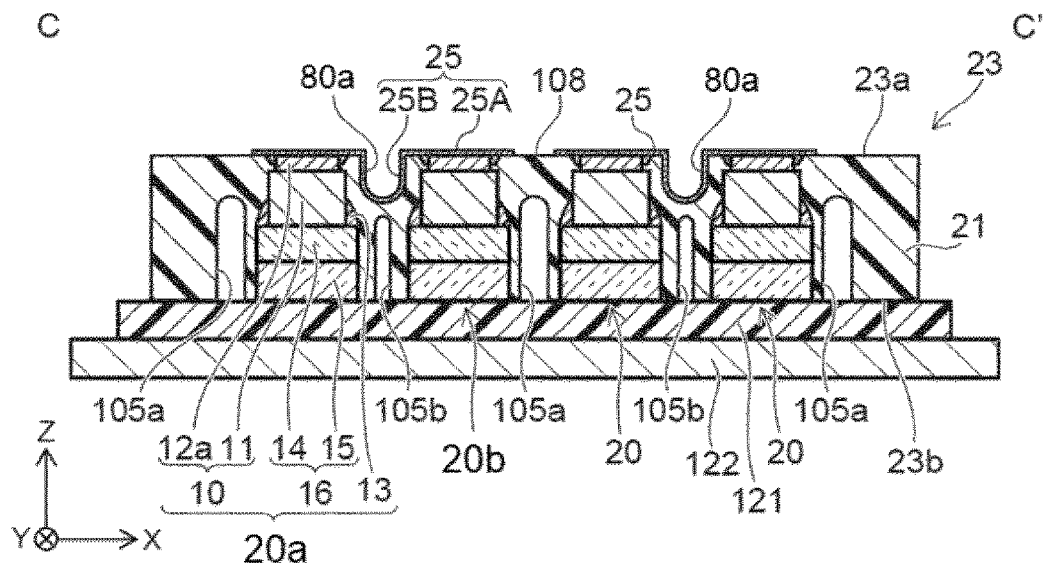
FIG. 10B is a schematic end view taken along line C-C' shown in FIG. 10A.

Next, as shown in FIG. 10A and FIG. 10B, the conductive film 25 is formed on the first electrodes 12a and the second electrodes 12b of the layered structures 20 exposed from the first surface 23a of the intermediate structure 23, and on the inner surface of the first holes 80a and the second holes 80b. As for the method for forming the conductive film 25, a known method such as sputtering, vapor deposition, application, stamping, printing, ALD, CVD and plating may be employed. Particularly, it is preferred to use sputtering as the method for forming the conductive film 25. By employing sputtering, it is easy to improve the adhesion of the conductive film 25 to the first electrode 12a and the second electrode 12b exposed on the first surface 23a, and the light reflecting member 21 located on the first surface 23a and the inner surface of the first hole 80a and the second hole 80b. Thus, it is possible to prevent the conductive film 25 from peeling off of the first surface 23a and the inner surface of the first hole 80a and the second hole 80b.

When sputtering is employed as the method for forming the conductive film 25, the step of selectively removing the conductive film 25 that has been formed in unwanted regions may be performed. When sputtering is employed as the method for forming the conductive film 25, for example, the conductive film 25 may be formed in an inter-electrode region 107 of the first surface 23a between the first electrode 12a and the second electrode 12b, and an inter-electrode region 108 of the first surface 23a that is a region between adjacent first electrodes 12a and between adjacent second electrodes 12b and where the first hole 80a and the second hole 80b are absent. The step of selectively removing the conductive film 25 is performed by laser light irradiation, an etching method, blasting or a photolithography method, for example. Specifically, the step removes the portions of the conductive film 25 that covers the inter-electrode region 107 and the portions of the conductive film 25 that covers an inter-electrode region 108. Thus, the light reflecting member 21 located in the inter-electrode regions 107 and 108 is exposed. On the other hand, the electrodes 12a and 12b are covered by the conductive film 25. The inner surface of the first hole 80a and the second hole 80b is also covered by the conductive film 25.

As the method for selectively removing the conductive film 25, it is preferred to employ laser light irradiation. By employing laser light irradiation, the conductive film 25 can be patterned without using a mask, or the like. Note that laser abrasion refers to the phenomenon in which the surface of a solid is removed when the intensity of laser light with which the surface of the solid is irradiated exceeds a certain level (threshold value).

When the conductive film 25 is removed by using laser light, the wavelength of the laser light is preferably such a wavelength that has a low reflectivity, e.g., a wavelength that has a reflectivity of 90% or less, against the conductive film 25. Where the uppermost surface of the conductive film 25 is gold (Au), a laser having an emission wavelength shorter than the green region (e.g., 550 nm) is more preferred than using a laser in the red region (e.g., 640 nm). Then, it is possible to efficiently cause laser abrasion, thereby increasing the mass-productivity.

Note that the conductive film 25 may be formed selectively on the first electrode 12a and the second electrode 12b and the inner surface of the first hole 80a and the second hole 80b by forming the conductive film 25 through a mask on the first surface 23a, or by partially providing a conductive paste onto the first surface 23a, for example. Then, it is possible to omit the step of selectively removing the conductive film 25, for example, and it is possible to shorten the manufacturing process. When partially providing a conductive paste, by stamping a conductive paste between adjacent first electrodes 12a and between adjacent second electrodes 12b, for example, it is possible to form the conductive film 25 that extends continuously from over the first electrode 12a into the first hole 80a, and to form the conductive film 25 that extends continuously from over the second electrode 12b into the second hole 80b.

The conductive film 25 is preferably a conductive film that has a good corrosion resistance and a good oxidation resistance. For example, the layer of the uppermost surface of the conductive film 25 is a metal from the platinum group such as gold or platinum. Particularly, the uppermost surface of the conductive film 25 is preferably gold, which has a good solderability.

The conductive film 25 may be formed only from a single layer of a single material or may be formed from a plurality of layers of different materials. The conductive film 25 may be formed from a layer including gold, silver, tin, platinum, rhodium, titanium, ruthenium, molybdenum, tantalum, aluminum, tungsten, palladium or nickel, or an alloy thereof. Particularly, the conductive film 25 preferably includes a metal having a high melting point such as ruthenium, molybdenum and tantalum. With such a material, it is possible to improve the heat resistance of the conductive film 25. For example, where the conductive film 25 is formed from a plurality of layers, by providing these metals having a high melting point on the inner side of the uppermost layer of the conductive film 25, it is possible to alleviate diffusion of Sn contained in the solder into the light emitting device 1. The conductive film 25 may have a layered structure such as Ni/Ru/Au or Ti/Pt/Au, for example. The thickness of the metal layer including a metal having a high melting point such as ruthenium is preferably about 10 Å (angstrom) to about 1000 Å.

The planar shape of the conductive film 25 on the first surface 23a may be a rectangular shape, a circular shape, an elliptical shape, or a combination thereof. The outer edge of the conductive film 25 on the first surface 23a may be a straight line, a curved line or a shape that is a combination of a straight line and a curved line. For example, the planar shape of the conductive film 25 on the first surface 23a may be an L-letter shape or a T-letter shape. The planar shape of the conductive film 25 on the first electrode 12a and the planar shape of the conductive film 25 on the second electrode 12b may be different from each other. By varying the planar shape of the conductive film 25, it is easier to distinguish between polarities of the electrodes of the light emitting devices 1, for example.

The conductive film 25 may have the thickness of 0.01 μm to 0.2 μm, for example, and preferably 0.05 μm to 0.1 μm. The thickness of the conductive film 25 located on the first surface 23a and the thickness of the conductive film 25 located on the inner surface of the first hole 80a and the second hole 80b may be equal to each other or different from each other. Where the thickness of the conductive film 25 located on the first surface 23a is thicker than the thickness of the conductive film 25 located on the inner surface of the first hole 80a and the second hole 80b, heat generated by the light emitting element 10 can be efficiently dissipated to the outside through the conductive film 25 located on the first surface 23a. Where the thickness of the conductive film 25 located on the inner surface of the first hole 80a and the second hole 80b is thicker than the thickness of the conductive film 25 located on the first surface 23a, heat generated by the light emitting element 10 can be efficiently dissipated to the mounting substrate side through the conductive film 25 located on the inner surface of the first hole 80a and the second hole 80b.

The conductive film 25 located on the first surface 23a and the conductive film 25 located on the inner surface of the first hole 80a and the second hole 80b may be arranged partially spaced apart from each other as long as they are electrically connected to each other by a bonding member when the obtained light emitting device 1 is mounted. For example, at a corner portion that is the connecting portion between the first surface 23a and the inner surface of the first hole 80a, or the like, the conductive film 25 located on the first surface 23a and the conductive film 25 located on the inner surface of the first hole 80a, or the like, may be spaced apart from each other. The corner portion that is the connecting portion between the first surface 23a and the inner surface of the first hole 80a, or the like, is likely to be chipped or deformed due to an external force. However, as the conductive film 25 located on the first surface 23a and the conductive film 25 located on the inner surface of the first hole 80a, or the like, are arranged spaced apart from each other in the vicinity of the corner portion, even if the external force described above occurs at the corner portion, it is possible to reduce the possibility that the external force influences the portions of the conductive film 25. The distance between the conductive film 25 located on the first surface 23a and the conductive film 25 located on the inner surface of the first hole 80a and the second hole 80b may be set to a half or less of the thickness of a block-shaped bonding member (e.g., a solder) before being melted, for example.

(Step of Obtaining a Plurality of Light Emitting Devices 1)

Figure 11A:
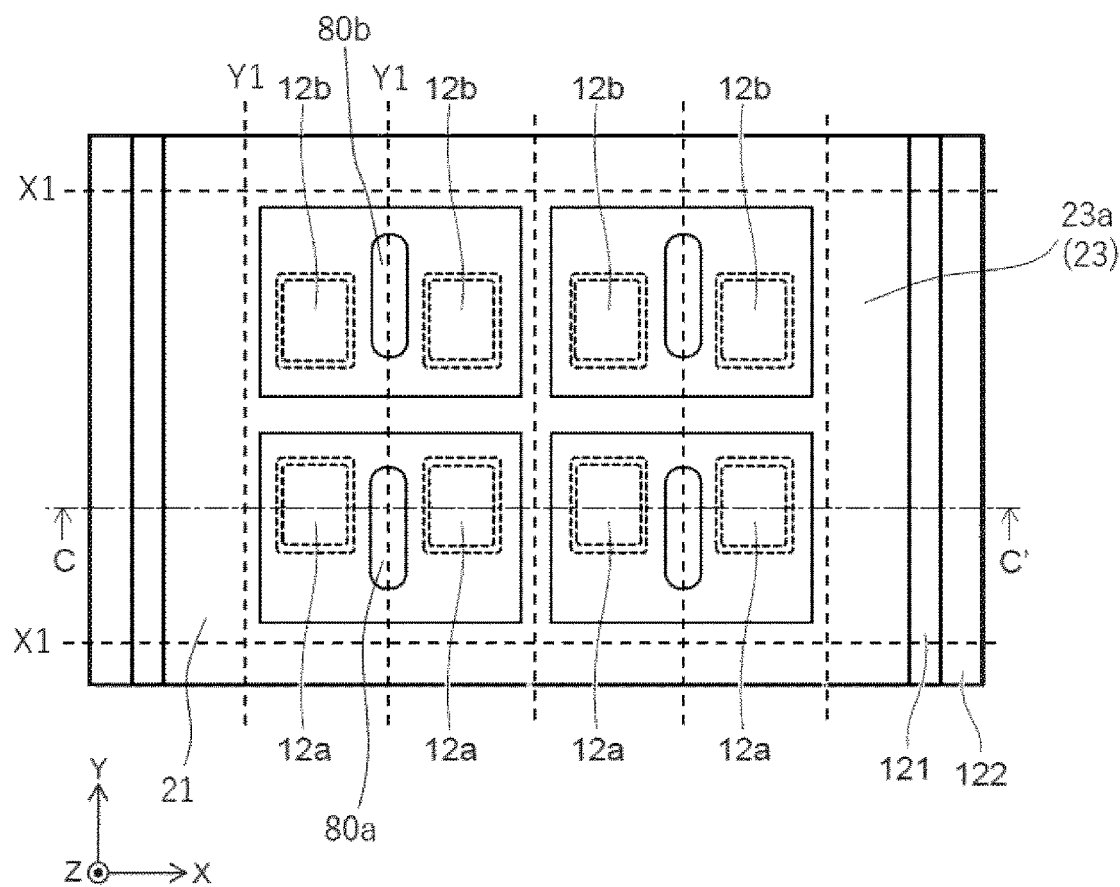
FIG. 11A is a schematic plan view showing a method for manufacturing a light emitting device according to an embodiment.
Figure 11B:
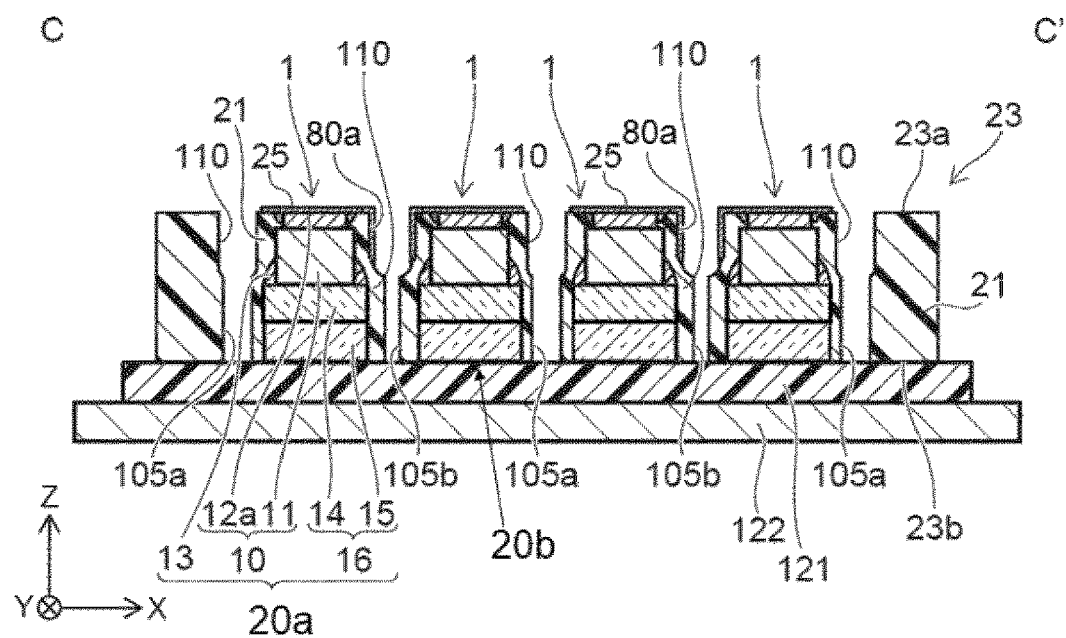
FIG. 11B is a schematic end view taken alone line C-C' shown in FIG. 11A.

Next, as shown in FIG. 11A and FIG. 11B, the intermediate structure 23 is severed from the first surface 23a side, thereby forming second grooves 110. In FIG. 11A, each light emitting device 1 can be obtained by severing the structure along a pair of first severing lines X1 and a pair of second severing lines Y1. At least one of the pair of second severing lines Y1 passes through the first hole 80a and the second hole 80b.

The third grooves 110 are formed so as to oppose the grooves 105a and the grooves 105b. That is, the third grooves 110 are made to reach the grooves 105a and the grooves 105b. Thus, the third grooves 110, the grooves 105a and the grooves 105b run through the intermediate structure 23 in the third direction (the Z direction), thereby dividing the intermediate structure 23. By forming the third grooves 110 as described above, the conductive film 25 and the light reflecting member 21 are severed through the first holes 80a and the second holes 80b. As a result, a plurality of light emitting devices 1 are obtained. As the severing method, it is preferred to sever the structure by dicing while jetting a fluid such as water onto the severed surface of the intermediate structure 23, for example. Thus, it is possible to alleviate deformation of the light reflecting member 21, or the like, due to heat that is generated from the severing. Note that a known severing method such as dicing, including a dry cut method, and a laser abrasion may be used as the severing method.

The width of the third groove 110 is preferably larger than the width of the groove 105a and the groove 105b and smaller than the width of the first hole 80a and the second hole 80b. By making the width of the third groove 110 larger than the width of the groove 105a and the groove 105b, it is possible to prevent the width of the light emitting device 1 on the side of the pair of electrodes 12a and 12b from being larger than the width of the light emitting device 1 on the light transmissive member 16 side. Thus, it is possible to realize a size reduction of the light emitting device 1. With the width of the third groove 110 being smaller than the width of the first hole 80a and the second hole 80b, it is possible to prevent the conductive film 25 formed in the first hole 80a and the second hole 80b from being removed. It is preferred that the distance between the widest portion of the third groove 110 and the side surface of the light emitting element 10 in the first direction (the X direction) is set to be 20 µm to 60 µm, for example, and preferably 30 µm to 40 µm. Then, it is possible to alleviate leakage, to the outside, of light exiting through the side surface of the light emitting element 10. The width of the third groove 110 is 60 µm to 140 µm, for example, and preferably 80 µm to 120 µm.

The depth of the third groove 110 is set to a depth that reaches the groove 105a and the groove 105b. Note that the third groove 110 is preferably formed so that the deepest portion (the bottom surface) of the third groove 110 is located on the upper side relative to the upper surface of the light emitting element 10 in the third direction (the Z direction). Then, the thickness of the light reflecting member 21 located on the side of the light transmissive member 16 can be left to be thick. As a result, it is possible to alleviate leakage, to the outside through the light reflecting member 21, of light exiting to the outside through the side surface of the light transmissive member 16.

The depth of the third groove 110 is 50 µm to 300 µm, for example, and preferably 100 µm to 200 µm. The depth of the third groove 110 that opposes the groove 105a and the depth of the third groove 110 that opposes the groove 105b may be different from each other. For example, the depth of the third groove 110 that opposes the groove 105b can be made deeper than the depth of the third groove 110 that opposes the groove 105a. Then, the depression formed on the mounting surface side of the light emitting device 1 can be made larger. As a result, even if the amount of the bonding member 52 is excessive when arranging the light emitting device 1 on the mounting substrate 51 with the bonding member 52 therebetween, for example, the excess of the bonding member 52 can be accommodated in the depression. Thus, it is possible to reduce the possibility of the light emitting device 1 being arranged with the light exit surface 30a of the light emitting device 1 being slanted.

Next, a light emitting device according to the present embodiment manufactured as described above, and a light source device having the light emitting device mounted thereon will be described.

Figure 12A:
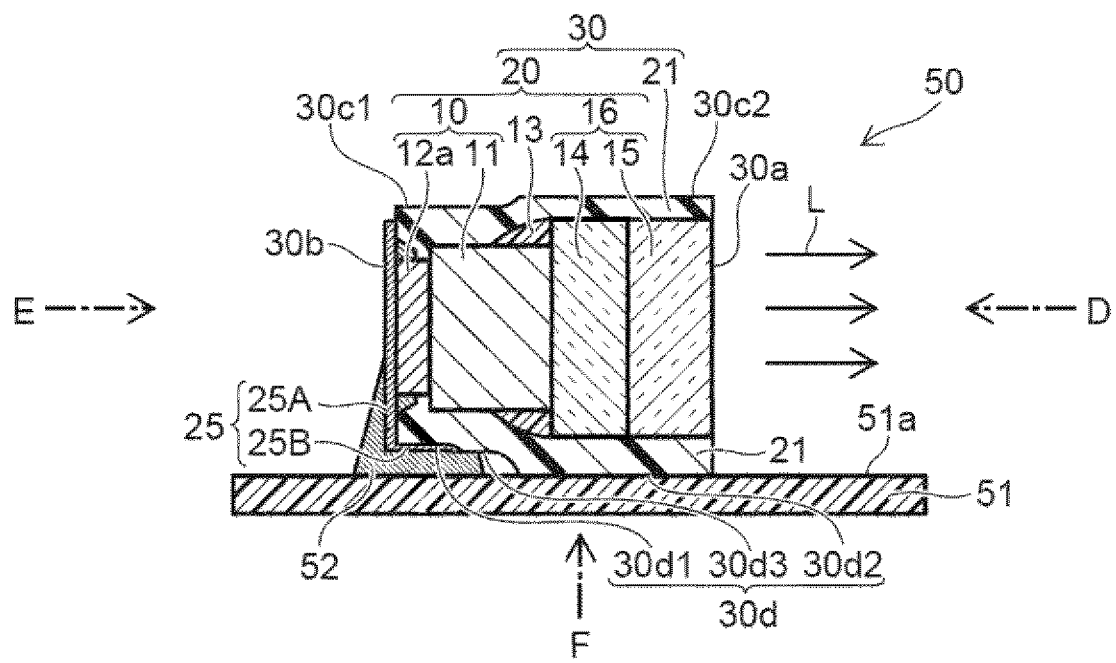
FIG. 12A is a schematic end view showing a light source device according to an embodiment.
Figure 12B:
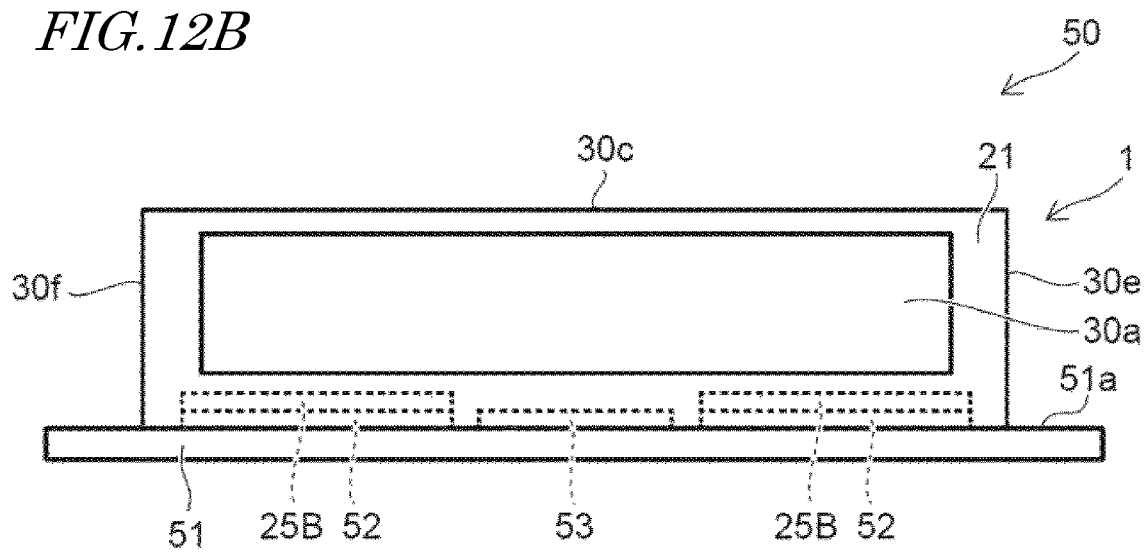
FIG. 12B is a schematic front view showing a light source device according to an embodiment.
Figure 13A:
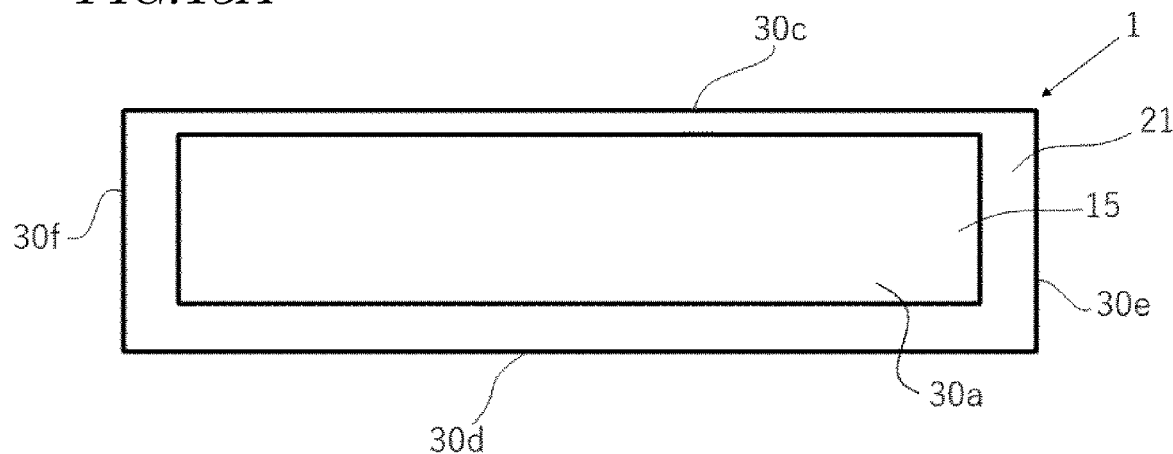
FIG. 13A is a schematic front view showing a light emitting device according to an embodiment.
Figure 13B:
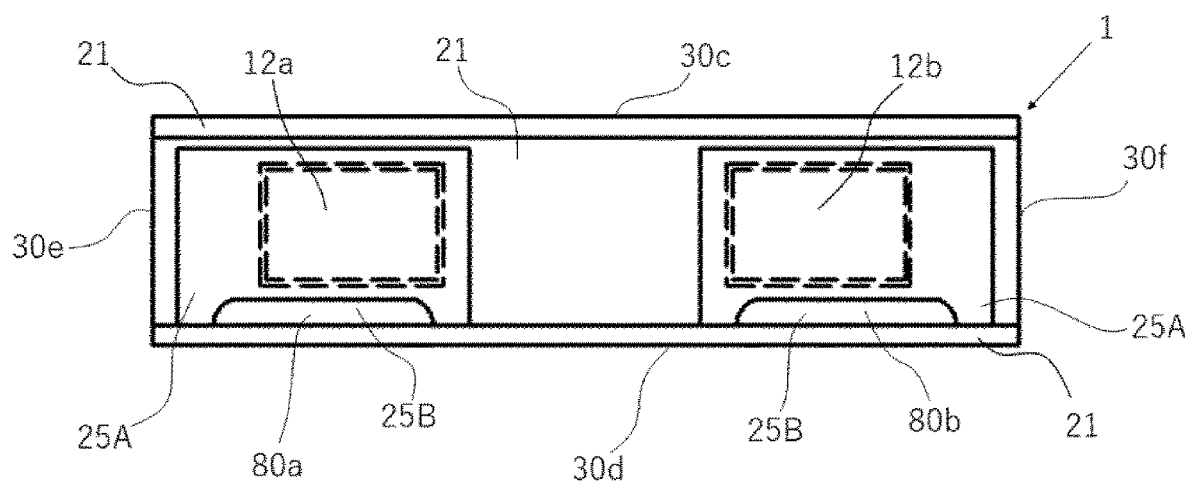
FIG. 13B is a schematic back view showing a light emitting device according to an embodiment.
Figure 13C:
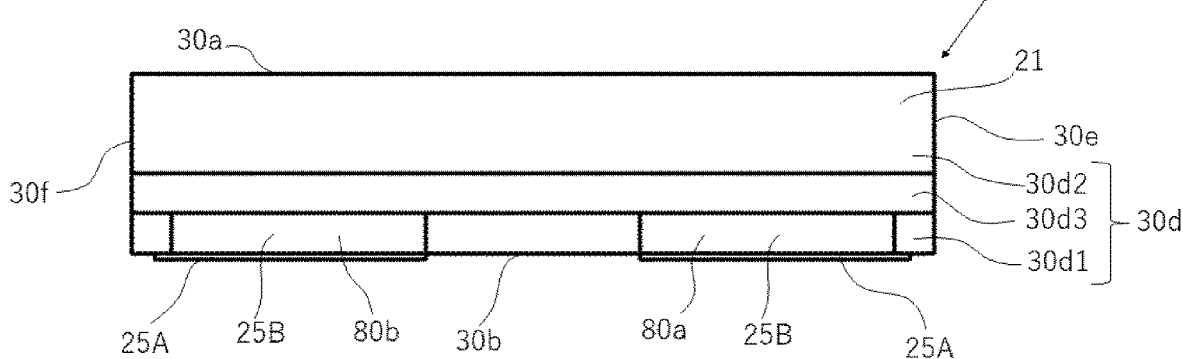
FIG. 13C is a schematic bottom view showing a light emitting device according to an embodiment.

FIG. 12A is an end view showing a light source device according to the present embodiment, and FIG. 12B is a front view of the light source device. FIG. 13A is a front view showing a light emitting device according to the present embodiment, FIG. 13B is a back view of the light emitting device, and FIG. 13C is a bottom view of the light emitting device. FIG. 12B is a view of a light source device 50 as viewed from the direction D shown in FIG. 12A. FIG. 13A is a view of the light emitting device 1 as viewed from the direction D shown in FIG. 12A, FIG. 13B is a view of the light emitting device 1 as viewed from the direction E, and FIG. 13C is a view of the light emitting device 1 as viewed from the direction F.

The light source device 50 according to the present embodiment includes the mounting substrate 51, the light emitting device 1, and a pair of bonding members 52. The light emitting device 1 is attached to the mounting substrate 51 by a pair of bonding members 52. The bonding member 52 is a solder or a conductive paste, for example. Note that the mounting substrate 51 and the bonding member 52 are not shown in FIG. 13A to FIG. 13C.

(Light Emitting Device 1)

Referring to FIG. 12A, FIG. 12B, FIG. 13A to FIG. 13C, the light emitting device 1 according to the present embodiment will now be described. The light emitting device 1 includes: a structure 30 including the light emitting element 10, the light transmissive member 16 provided on or above the light emitting element 10, and the light reflecting member 21 covering the side surfaces of the light emitting element 10 and the light transmissive member 16; a pair of first conductive films 25A provided on the first surface of the structure 30; and a pair of second conductive films 25B provided on the second surface of the structure 30.

The structure 30 includes the light exit surface 30a, a first surface 30b located on the opposite side from the light exit surface 30a, a second surface 30d that is connected to the light exit surface 30a and the first surface 30b and continuous with the first surface 30b, a third surface 30c located on the opposite side from the second surface 30d, and a fourth surface 30e and a fifth surface 30f. The light exit surface 30a is continuous with the second surface 30d, the third surface 30c, the fourth surface 30e and the fifth surface 30f, with a ridge interposed therebetween. The first surface 30b is continuous with the second surface 30d, the third surface 30c, the fourth surface 30e and the fifth surface 30f, with a ridge interposed therebetween. The fourth surface 30e and the fifth surface 30f are flat and are entirely formed by the light reflecting member 21.

The surfaces of the light emitting device 1 corresponding to the surfaces of the structure 30 will be herein referred to by the same terms as the light exit surface 30a, the first surface 30b, etc., of the structure 30. The light emitting device 1 is a side-emitting (side-view) light emitting device, wherein the second surface 30d is the mounting surface, and the second surface 30d and an upper surface 51a of the mounting substrate 51 oppose each other. Note that the light exit surface 30a is generally parallel to, and facing the same direction as, an upper surface 100a of the substrate 100 shown in FIG. 1A and FIG. 1B.

The structure 30 includes at least one layered structure 20. The layered structure 20 functions as the light source of the light emitting device 1, and includes the light emitting element 10 and the light transmissive member 16. The light emitting element 10 is a light emitting diode (LED), for example, and includes the semiconductor layered structure 11 and the first electrode 12a and the second electrode 12b. The semiconductor layered structure 11 includes the n-type layer, the light emitting layer and the p-type layer layered together, and one of the n-type layer and the p-type layer is connected to the first electrode 12a with the other connected to the second electrode 12b.

On the first surface 30b of the structure 30, the first electrode 12a and the second electrode 12b are exposed from the light reflecting member 21. Thus, heat generated by the light emitting element 10 can be efficiently dissipated from the first surface 30b side of the structure. In FIG. 12A, the first surface 30b is flat, and the light reflecting member 21 is provided around the electrodes 12a and 12b.

The light transmissive member 16 is provided on or above the light emitting element 10. By arranging the light transmissive member 16 on or above the light emitting element 10, it is possible to protect the light emitting element 10 from an external stress. The side surface of the light transmissive member 16 is covered by the light reflecting member 21. With such a structure, the light emitting device has a high contrast between a light emitting region and a non-light emitting region, namely, has a highly clear border between the light emitting region and the non-light emitting region. In FIG. 12A and FIG. 123, the light exit surface 30a is flat, and the light reflecting member 21 is provided around the light transmissive member 16.

The light transmissive member 16 can have the phosphor layer 14 and/or the light transmissive layer 15. The light transmissive member 16 preferably has the phosphor layer 14 that contains a phosphor. Then, it is possible to output light of an intended mixed color by mixing together light emitted from the light emitting element 10 and light emitted from the phosphor. The phosphor may be evenly dispersed across the phosphor layer 14 or the phosphor may be unevenly distributed on the light emitting element 10 side relative to the upper surface of the phosphor layer 14. By unevenly distributing the phosphor on the light emitting element 10 side relative to the upper surface of the phosphor layer 14, it is possible to alleviate deterioration, due to moisture, of a phosphor that is not resistant to moisture. An example phosphor that is not resistant to moisture is a manganese activated fluoride-based phosphor, for example. A manganese activated fluoride-based phosphor is a phosphor that is preferred in view of color reproducibility as it gives an emission with a relatively narrow spectral line width.

The phosphor may be a single phosphor or a plurality of different phosphors. For example, the phosphor layer 14 may be a single layer, wherein the single-layer phosphor layer 14 contains a manganese activated fluoride-based phosphor and a β SiAlON-based phosphor. Alternatively, the phosphor layer 14 may include a plurality of phosphor layers. For example, the phosphor layer 14 may include a phosphor layer that contains a manganese activated fluoride-based phosphor, and a phosphor layer that contains a β SiAlON-based phosphor.

The layered structure 20 may include the lightguide member 13 at least a portion of which is arranged between the light emitting element 10 and the light transmissive member 16. The lightguide member 13 covers the side surface of the light emitting element 10, and guides light emitted from the side surface of the light emitting element 10 in the direction toward the upper surface of the light emitting device 1 (i.e., toward the light exit surface 30a side). By arranging the lightguide member 13 on the side surface of the light emitting element 10, it is possible to prevent a portion of light that has reached the side surface of the light emitting element 10 from being reflected by the side surface to attenuate in the light emitting element 10.

The lightguide member 13 can cover the upper surface of the light emitting element 10 in addition to the side surface of the light emitting element 10. With such an arrangement, it is possible to improve the adhesion strength between the light emitting element 10 and the lightguide member 13.

The lightguide member 13 is a member that includes a resin material as the base material, for example. The resin material may preferably be a light transmissive resin such as a silicone resin, a silicone modified resin, an epoxy resin and a phenol resin, for example. Note that the lightguide member 13 preferably has a high light transmittance. Therefore, the lightguide member 13 preferably has substantially no substance that reflects, absorbs or scatters light. Generally, the lightguide member 13 has a higher transmittance for light from the light emitting element 10 than the light reflecting member 21.

The light reflecting member 21 forms the outer surface of the light emitting device 1. With the light emitting device 1 shown in FIG. 12A, FIG. 12B, FIG. 13A to FIG. 13C, the light reflecting member 21 is present on any of the outer surfaces, i.e., the light exit surface 30a, the first surface 30b, the second surface 30d, the third surface 30c, the fourth surface 30e and the fifth surface 30f. The light reflecting member 21 covers the side surface of the light emitting element 10 and the side surface of the light transmissive member 16. With the light reflecting member 21 located on the side of the light emitting element 10, light emitted sideways of the light emitting element 10 can be reflected by the light reflecting member 21, and it is possible to efficiently extract light in the upward direction (i.e., in the direction toward the light exit surface 30a side). It is preferred that the light reflecting member 21 also covers the lower surface of the light emitting element 10. Then, light emitted downward from the light emitting element 10 can be reflected upward, for example. With the light reflecting member 21 covering the lower surface of the light emitting element 10, it is possible to improve the adhesion strength between the light emitting element 10 and the light reflecting member 21.

Comparing the difference in the coefficient of thermal expansion between the lightguide member 13 and the light emitting element 10 (this will be referred to as the "first thermal expansion difference $\Delta T30$") with the difference in the coefficient of thermal expansion between the light reflecting member 21 and the light emitting element 10 (this will be referred to as the "second thermal expansion difference $\Delta T40$"), the material of the light reflecting member 21 is preferably selected so that $\Delta T40 < \Delta T30$ holds. Then, it is possible to alleviate peel-off of the lightguide member 13 from the light emitting element 10.

The third surface 30c is formed of the light reflecting member 21. In this example, the third surface 30c includes two regions, namely, an electrode-side region 30c1 that is arranged on the side of the first electrode 12a and the second electrode 12b, and a light exit side region 30c2 that is arranged on the light transmissive member 16 side. The electrode-side region 30c1 is depressed, relative to the light exit side region 30c2, in the direction from the third surface 30c toward the second surface 30d. Note that the electrode-side region 30c1 is the side surface of the third groove 110, and the light exit side region 30c2 is the side surface of the groove 105a (see, e.g., FIG. 11B).

In FIG. 13C, the second surface 30d includes a first region 30d1 (the electrode-side region) that is arranged on the side of the first electrode 12a and the second electrode 12b, a second region 30d2 (the light exit side region) that is arranged on the light transmissive member 16 side, and a middle region 30d3 that is arranged between the first region 30d1 and the second region 30d2. The middle region 30d3 is depressed relative to the second region 30d2 (the light exit side region), and the first region 30d1 (the electrode-side region) is depressed relative to the middle region 30d3. Therefore, the first region 30d1 (the electrode-side region) is depressed relative to the second region 30d2 (the light exit side region). This makes it easier to arrange the bonding member 52 between the mounting substrate 51 and the first region 30d1 (the electrode-side region) when mounting the light emitting device 1 on the mounting substrate 51. The second region 30d2 (the light exit side region) is the side surface of the groove 105b, the middle region 30d3 is the side surface of the third groove 110, and the first region 30d1 (the electrode-side region) is the side surface of the first hole 80a and the second hole 80b.

A pair of first conductive films 25A are provided on the first surface 30b of the structure 30. One of the first conductive films 25A is spaced apart from the other. The pair of first conductive films 25A cover the first electrode 12a and the second electrode 12b, respectively, and are connected to the electrodes 12a and 12b, respectively. On the first surface 30b of the light emitting device 1, only the light reflecting member 21 and the pair of first conductive films 25A are exposed. With the pair of first conductive films 25A located on the first surface 30b, heat generated by the light emitting element 10 can be efficiently dissipated from the first surface 30b side.

On the first surface 30b, it is preferred that the first conductive film 25A is spaced apart from the third surface 30c. Then, for the process of mounting the light emitting device 1 on the mounting substrate using a bonding member such as a solder, it is possible to reduce the possibility of a tombstone phenomenon occurring on the light emitting device 1 or the possibility of the light emitting device 1 being arranged with a light exit surface 30a of the light emitting device 1 being slanted.

Note that, on the first surface 30b, the first conductive film 25A may be extended to the third surface 30c. In such a case, the end portion of the first conductive film 25A can be aligned with the end portion of the third surface 30c, for example. Alternatively, a portion of the first conductive film 25A may be formed also on the third surface 30c, in addition to the first surface 30b. With such an arrangement, it is possible to further improve the heat dissipation of the light emitting device 1.

On the first surface 30b, it is preferred that the pair of first conductive films 25A are spaced apart from the fourth surface 30e and the fifth surface 30f. Then, when the light emitting device 1 is mounted on the mounting substrate using a bonding member, it is possible to alleviate the flow of the bonding member to the outer side of the fourth surface 30e and the fifth surface 30f. As a result, it is possible to reduce the mounting area of the light emitting device 1 including the bonding member. For example, where a light source including a plurality of light emitting devices arranged on the mounting substrate is used as the light source of an edge-type liquid crystal display device, areas between the light emitting devices are likely to be dark areas. However, with the light emitting device 1 where the first conductive films 25A are arranged as described above, where a plurality of light emitting devices are arranged so that the fourth surface 30e of one light emitting device and the fifth surface 30f of another light emitting device, adjacent to the first light emitting device on the mounting substrate, oppose each other, it is possible to shorten the distance between light emitting devices. Thus, it is possible to reduce the regions to be dark areas between light emitting devices.

The corner portion of the light emitting device including the connecting portion between the fourth surface 30e, etc., and the first surface 30b is likely to be chipped or deformed due to an external force. However, with the first conductive film 25A spaced apart from the fourth surface 30e, etc., even if the external force described above occurs on the corner portion of the light emitting device 1, it is possible to reduce the possibility that the external force affects the first conductive film 25A.

Note that, on the first surface 30b, the first conductive film 25A may be extended to the fourth surface 30e and the fifth surface 30f. In such a case, the end portion of the first conductive film 25A can be aligned with the end portion of the fourth surface 30e and the fifth surface 30f, for example. Alternatively, a portion of the first conductive film 25A may be formed also on the fourth surface 30e and the fifth surface 30f, in addition to the first surface 30b. With such an arrangement, it is possible to further improve the heat dissipation of the light emitting device 1.

The pair of second conductive films 25B is provided on the first region 30d1 (the electrode-side region) of the second surface 30d of the structure 30. The pair of second conductive films 25B are spaced apart from each other, and are provided so as to be continuous with the pair of first conductive films 25A, respectively. More specifically, one of the pair of second conductive films 25B is formed continuous with one of the pair of first conductive films 25A, thereby forming one of the conductive films 25 connected to the first electrode 12a. The other one of the pair of second conductive films 25B is formed continuous with the other one of the pair of first conductive films 25A, thereby forming the other one of the conductive films 25 connected to the second electrode 12b.

The pair of conductive films 25 function as electrodes for mounting the light emitting device 1. The second conductive film 25B is absent on the middle region 30d3 and on the second region 30d2 (the light exit side region) of the second surface 30d (i.e., the lower surface). With the pair of second conductive films 25B located on the second surface 30d, heat generated by the light emitting element 10 can be efficiently dissipated from the second surface 30d side.

On the second surface 30d, the second conductive film 25B is preferably spaced apart from the light exit surface 30a. Thus, when the light emitting device 1 is mounted on the mounting substrate using a bonding member, it is possible to alleviate the flow of the bonding member to the side of the light exit surface 30a, which is to be the light emitting surface. As a result, it is possible to reduce the possibility that light emitted from the light emitting device 1 is blocked by the bonding member, for example.

Note that, on the second surface 30d, the second conductive film 25B may be extended to the light exit surface 30a. In such a case, the end portion of the second conductive film 25B can be aligned with the end portion of the light exit surface 30a, for example. Alternatively, a portion of the second conductive film 25B can be formed also on the light exit surface 30a, in addition to the second surface 30d. Thus, it is possible to further improve the heat dissipation of the light emitting device 1.

On the second surface 30d, it is preferred that the second conductive film 25B is spaced apart from the fourth surface 30e and the fifth surface 30f. Then, when the light emitting device 1 is mounted on the mounting substrate using a bonding member, it is possible to alleviate the flow of the bonding member to the outer side of the fourth surface 30e and the fifth surface 30f. As a result, it is possible to reduce the mounting area of the light emitting device 1 including the bonding member. For example, where a light source including a plurality of light emitting devices arranged on the mounting substrate is used as the light source of an edge-type liquid crystal display device, areas between the light emitting devices are likely to be dark areas. However, with the light emitting device 1 where the second conductive films 25B are arranged as described above, where a plurality of light emitting devices are arranged so that the fourth surface 30e of one light emitting device and the fifth surface 30f of another light emitting device, adjacent to the first light emitting device on the mounting substrate, oppose each other, it is possible to shorten the distance between light emitting devices. Thus, it is possible to reduce the regions to be dark areas between light emitting devices.

The corner portion of the light emitting device including the connecting portion between the fourth surface 30e and the second surface 30d is likely to be chipped or deformed due to an external force. However, with the second conductive film 25B spaced apart from the fourth surface 30e, etc., even if the external force described above occurs on the corner portion of the light emitting device 1, it is possible to reduce the possibility that the external force affects the second conductive film 25B.

Note that, on the second surface 30d, the second conductive film 25B may be extended to the fourth surface 30e and the fifth surface 30f. In such a case, the end portion of the second conductive film 25B can be aligned with the end portion of the fourth surface 30e and the fifth surface 30f, for example. Alternatively, a portion of the second conductive film 25B may be formed also on the fourth surface 30e and the fifth surface 30f, in addition to the second surface 30d. With such an arrangement, it is possible to further improve the heat dissipation of the light emitting device 1.

(Light Source Device 50)

Next, referring to FIG. 12A and FIG. 12B, the light source device 50 including the light emitting device 1 arranged on the mounting substrate 51 will be described. The light emitting device 1 is arranged on the mounting substrate 51 so that the second surface 30d is the mounting surface.

The mounting substrate 51 includes a base and a wiring pattern formed on the base. The mounting substrate 51 is an elongate member that has the longitudinal direction and the width direction, for example. A plurality of light emitting devices 1 can be arranged on the mounting substrate 51, and the plurality of light emitting devices 1 are preferably arranged on the mounting substrate 51 along the longitudinal direction of the mounting substrate 51.

The light emitting device 1 and the mounting substrate 51 are primarily attached together by a pair of bonding members 52. The pair of bonding members 52 are conductive and may be members such as a solder.

The pair of bonding members 52 are arranged at least between the first region 30d1 (the electrode-side region) of the second surface 30d (the mounting surface) of the light emitting device 1 and the upper surface 51a of the mounting substrate 51, and are in contact with the pair of second conductive films 25B, respectively. Thus, the bonding members 52 attach the light emitting device 1 to the mounting substrate 51. The bonding members 52 may be arranged also on the first surface 30b (the back surface) of the light emitting device 1, and between the middle region 30d3 of the second surface 30d (the mounting surface) and the mounting substrate 51, and the bonding members 52 are also in contact with the first conductive films 25A.

On the second surface 30d (the mounting surface) of the light emitting device 1, the region contacted by the adhesive member 53 is preferably located between the pair of bonding members 52. Thus, it is possible to alleviate inadvertent contact between the pair of bonding members 52, for example. That is, by arranging the insulative adhesive member 53 between the pair of bonding members 52 on the second surface 30d (the mounting surface) of the light emitting device 1, it is possible to alleviate electrical short circuit between terminals. With the adhesive member 53 located between the pair of bonding members 52, it is possible to alleviate the flow of the adhesive member 53 to the outer side of the fourth surface 30e and the fifth surface 30f. This is particularly useful when the viscosity of the material of the adhesive member 53 is lower than the viscosity of the material of the bonding member 52. Then, it is possible to reduce the mounting area of the light emitting device 1.

The light emitting device 1 and the mounting substrate 51 may be attached together by further using an adhesive member 53, in addition to the pair of bonding members 52. The adhesive member 53 is an insulative adhesive, for example. With the light source device 50 shown in FIG. 12B, the adhesive member 53 attaches together the second surface 30d (the mounting surface) of the light emitting device 1 and the upper surface of the mounting substrate 51. By using the adhesive member 53, in addition to the pair of bonding members 52, it is possible to further increase the joining strength between the light emitting device 1 and the mounting substrate 51.

The adhesive member 53 may be an epoxy resin, for example. Then, by using an epoxy resin as the resin material to be the base material of the light reflecting member 21, for example, it is possible to increase the joining strength between the adhesive member 53 and the light emitting device 1. On the second surface 30d (the mounting surface) of the light emitting device 1, the adhesive member 53 may be in contact only with the light reflecting member 21.

Components of the light emitting device 1 and the light source device 50 according to one embodiment of the present disclosure will be described hereinbelow.

Light Emitting Element 10

The light emitting element 10 is an LED chip, for example. The light emitting element 10 may have a semiconductor layered structure including a nitride semiconductor ($In_xAl_yGa_{1-x-y}N$, $0 \leq x$, $0 \leq y$, $x+y \leq 1$) capable of emitting light in the ultraviolet to visible range, for example. In view of the emission efficiency of the light emitting device and the excitation spectrum and the color mixability of the phosphor, etc., the emission peak wavelength of the light emitting element 10 is preferably 400 nm or more and 530 nm or less, more preferably 420 nm or more and 490 nm or less, and even more preferably 450 nm or more and 475 nm or less.

There may be one light emitting element or two or more light emitting elements. Where there are a plurality of light emitting elements, the plurality of light emitting elements may be a plurality of blue light emitting elements that emit blue light, three light emitting elements that emit blue light, green light and red light, respectively, or a combination of a light emitting element that emits blue light and a light emitting element that emits green light, for example. Where the light emitting device 1 is used as the light source of a liquid crystal display device, or the like, the light emitting element is preferably one light emitting element that emits blue light, two light emitting elements that emit blue light, three or more light emitting elements that emit blue light, or a combination of a light emitting element that emits blue light and a light emitting element that emits green light. The light emitting element that emits blue light and the light emitting element that emits green light are each preferably a light emitting element whose half width is 40 nm or less, and more preferably a light emitting element whose half width is 30 nm or less. In other words, blue light and green light have sharp peaks. As a result, where the light emitting device is used as the light source of a liquid crystal display device, or the like, for example, the liquid crystal display device can realize a high color reproducibility. A plurality of light emitting elements can be electrically connected together in series, in parallel, or by a connection method that combines together series and parallel connections.

Although there is no particular limitation on the planar shape of the light emitting element 10, it may be a square shape or a rectangular shape that is elongated in one direction. The planar shape of the light emitting element 10 may be a hexagonal shape or any other polygonal shape. The side surface of the light emitting element 10 may be perpendicular to the upper surface of the light emitting element 10, or may be slant inward or outward.

The light emitting element 10 includes a pair of a positive electrode and a negative electrode. The positive and negative electrodes may each be formed of gold, silver, copper, tin, platinum, rhodium, titanium, aluminum, tungsten, palladium, nickel, or an alloy thereof.

Light Transmissive Member 16

The light transmissive member 16 is a member provided on or above the light emitting element 10 for protecting the light emitting element 10. The light transmissive member 16 may be a single layer or multiple layers. Where the light transmissive member 16 includes a plurality of layers, the layers may have the same base material or different base materials.

The base material of the light transmissive member 16 is transmissive to light from the light emitting element 10. Being transmissive, as used herein, means that the light transmittance at the emission peak wavelength of the light emitting element 10 is 60% or more, preferably 70% or more, and more preferably 80% or more.

The base material of the light transmissive member 16 may be a silicone resin, an epoxy resin, a phenol resin, a polycarbonate resin, an acrylic resin, or a modified resin thereof, for example. The base material of the light transmissive member 16 may be a glass. Particularly, a silicone resin and an epoxy resin are preferably used for their good thermal resistance and good light fastness. Example silicone resins include a dimethyl silicone resin, a phenyl-methyl silicone resin, a diphenyl silicone resin, etc. Note that a modified resin, as used herein, includes a hybrid resin.

The light transmissive member 16 may contain light diffusing particles. Example light diffusing particles include particles formed of silicon oxide, aluminum oxide, zirconium oxide, zinc oxide, etc. The light diffusing particles may be one of these alone, or may be two or more of these in combination. Particularly, silicon oxide, which has a small linear thermal expansion coefficient, is preferably used as the light diffusing particles. Moreover, nanoparticles are preferably used as the light diffusing particles. By using nanoparticles as the light diffusing particles, it is possible to increase the scattering of light emitted from the light emitting element, and it is possible to reduce the amount of phosphor to be used. Note that nanoparticles refer to particles whose particle size is 1 nm or more and 100 nm or less. The particle size, as used herein, is primarily defined by D50.

The light transmissive member 16 may include a phosphor. The phosphor is a member that absorbs at least a portion of primary light emitted from the light emitting element and emits secondary light that has a wavelength different from the primary light. The phosphor may be a single phosphor used alone or two or more different phosphors used in combination.

Example phosphors include a yttrium aluminum garnet-based phosphor (e.g., $Y_3(Al,Ga)_5O_{12}$:Ce), a lutetium aluminum garnet-based phosphor (e.g., $Lu_3(Al,Ga)_5O_{12}$:Ce), a terbium aluminum garnet-based phosphor (e.g., $Tb_3(Al,Ga)_5O_{12}$:Ce), a silicate-based phosphor (e.g., $(Ba,Sr)_2SiO_4$:Eu), a chlorosilicate-based phosphor (e.g., $Ca_8Mg(SiO_4)_4Cl_2$:Eu), a β SiAlON-based phosphor (e.g., $Si_{6-z}Al_zO_zN_{8-z}$:Eu (0<z<4.2)) an SGS-based phosphor (e.g., $SrGa_2S_4$:Eu), an alkaline earth aluminate-based phosphor (e.g., $(Ba,Sr,Ca)Mg_xAl_{10}O_{17-x}$:Eu,Mn) an a SiAlON-based phosphor (e.g., $M_z(Si,Al)_{12}(O,N)_{16}$ (where 0<z≤2, and M is Li, Mg, Ca, Y or a lanthanide element excluding La and Ce)), a nitrogen-containing calcium aluminosilicate-based phosphor (e.g., $(Sr,Ca)AlSiN_3$:Eu), and a manganese activated fluoride-based phosphor (a phosphor represented by general formula (I) $A_2[M_{1-a}Mn_aF_6]$ (where in general formula (I) above, A is at least one selected from the group consisting of K, Li, Na, Rb, Cs and $NH_4$; M is at least one element selected from the group consisting of group IV elements and group XIV elements; and a satisfies 0<a<0.2)). With an yttrium aluminum garnet-based phosphor, by partially substituting Y with Gd, it is possible to shift the emission peak wavelength toward the longer wavelength side. A typical example of a manganese activated fluoride-based phosphor is a manganese activated potassium fluorosilicate phosphor (e.g., $K_2SiF_6$:Mn). The light transmissive member 16 may be a sinter including a phosphor and an inorganic substance such as alumina, for example, or a plate-like crystal of a phosphor.

The light transmissive member 16 may include the phosphor layer 14 that contains a phosphor and the light transmissive layer 15 that does not substantially contain a phosphor. By including the light transmissive layer 15 on the upper surface of the phosphor layer 14, the light transmissive layer 15 can serve as a protection layer to alleviate deterioration of the phosphor in the phosphor layer 14. Note that "not substantially containing a phosphor" herein does not exclude inevitable contamination with a phosphor, and the phosphor content is 0.05 wt % or less, for example.

Light Reflecting Member 21

In view of light extraction efficiency in the direction toward the upper surface of the light emitting device 1, the light reflectivity of the light reflecting member 21 is preferably 70% or more, more preferably 80% or more, and even more preferably 90% or more, at the emission peak wavelength of the light emitting element 10. Moreover, the light reflecting member 21 is preferably white. The light reflecting member 21 may contain a light reflective substance in the resin material to be the base material. The light reflecting member 21 can be obtained by curing a liquid-form resin material. The light reflecting member 21 can be formed by transfer molding, injection molding, compression molding, a potting method, or the like.

The light reflecting member 21 may include a resin material as the base material. The resin material to be the base material may be a thermosetting resin, a thermoplastic resin, or the like. Specifically, it may be a resin such as an epoxy resin, a silicone resin, a modified epoxy resin such as a silicone modified epoxy resin, a modified silicone resin such as an epoxy modified silicone resin, an unsaturated polyester resin, a saturated polyester resin, a polyimide resin, a modified polyimide resin, a polyphthalamide (PPA), a polycarbonate resin, a polyphenylene sulfide (PPS), a liquid crystal polymer (LCP), an ABS resin, a phenol resin, an acrylic resin, a PBT resin, or the like. Particularly, the resin material of the light reflecting member 21 is preferably a thermosetting resin such as an epoxy resin or a silicone resin having a good thermal resistance and a good light fastness.

The light reflecting member 21 preferably contains a light reflective substance in the resin material to be the base material described above. The light reflective substance is preferably a substance that does not easily absorb light from a light emitting element and has a large refractive index difference relative to the resin material to be the base material. Such a light reflective substance may be titanium oxide, zinc oxide, silicon oxide, zirconium oxide, aluminum oxide, aluminum nitride, or the like, for example.

Adhesive Layer 13, Lightguide Member 13

The lightguide member 13 covers the side surface of the light emitting element 10 and guides light emitted from the side surface of the light emitting element 10 in the direction toward the upper surface of the light emitting device. That is, while a portion of light that has reached the side surface of the light emitting element 10 is reflected by the side surface to attenuate in the light emitting element 10, the lightguide member 13 can guide that light into the lightguide member 13 to extract the light to the outside of the light emitting element 10.

Resin materials listed for the light reflecting member 21 can be used for the adhesive layer 13 and the lightguide member 13. Particularly, a thermosetting light transmissive resin such as a silicone resin, a modified silicone resin, an epoxy resin and a phenol resin is preferably used as the adhesive layer 13 and the lightguide member 13.

The adhesive layer 13 and the lightguide member 13 may contain light diffusing particles and/or phosphors similar to those of the light transmissive member 16 described above. However, in view of achieving high light transmittance, it is normally preferred that the adhesive layer 13 and the lightguide member 13 be substantially free of an additive that reflects, absorbs or scatters light. Herein, "substantially free of an additive" does not exclude inevitable contamination with an additive.

For the light reflecting member 21, the lightguide member 13 and the light transmissive member 16, an epoxy resin can be selected as a resin material to be the base material. By selecting an epoxy resin, which as cured has a higher strength than a silicone resin, it is possible to improve the strength of the light emitting device 1. By forming the base material of each of these members from the same resin material, it is possible to improve the adhesion strength between these members. Where an epoxy resin is selected as the adhesive member 53, it is possible to improve the joining strength between the adhesive member 53 and the light reflecting member 21, etc.

Mounting Substrate 51

The mounting substrate 51 includes a plate-shaped base material made of glass epoxy resin, ceramic or polyimide, for example. The mounting substrate 51 includes land portions and wiring patterns made of copper, gold, silver, nickel, palladium, tungsten, chromium, titanium or an alloy thereof, etc., on the base material. The land portions and the wiring patterns are formed by using a method such as plating, lamination pressure bonding, adhesion, sputtering, vapor deposition, etching, etc.

Bonding Member 52

Any material known in the art can be used for the bonding member 52. The bonding member 52 may be, for example, a tin-bismuth-based solder, a tin-copper-based solder, a tin-silver-based solder, a gold-tin-based solder, or the like (specifically, an alloy whose primary components are Ag, Cu and Sn, an alloy whose primary components are Cu and Sn, an alloy whose primary components are Bi and Sn, etc.), an eutectic alloy (an alloy whose primary components are Au and Sn, an alloy whose primary components are Au and Si, an alloy whose primary components are Au and Ge, etc.), a conductive paste of silver, gold, palladium, etc., bumps or an anisotropic conductive material, a brazing material such as a low melting-point metal, etc.

Adhesive Member 53

As the adhesive member 53, resin materials such as an epoxy resin listed for the light transmissive member 16, or the materials listed for the bonding member 52, for example, can be used. The bonding member 52 and the adhesive member 53 may be the same member or different members. Where the bonding member 52 and the adhesive member 53 are different members, a solder, which is a conductive material, may be selected for the bonding member 52, and a resin material such as an epoxy resin for the adhesive member 53.

<Variations>

Figure 14A:
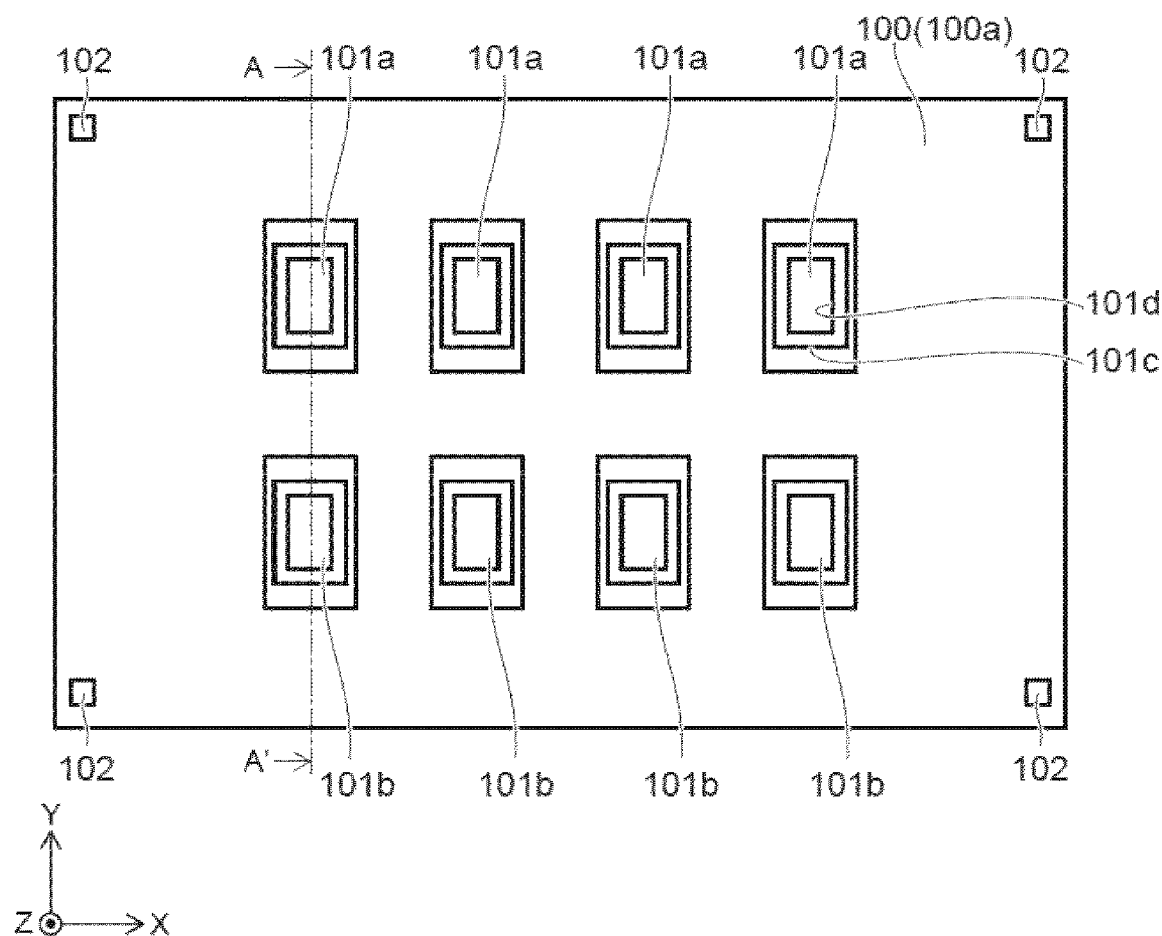
FIG. 14A is a schematic plan view showing a method for manufacturing a light emitting device according to a variation.
Figure 14B:
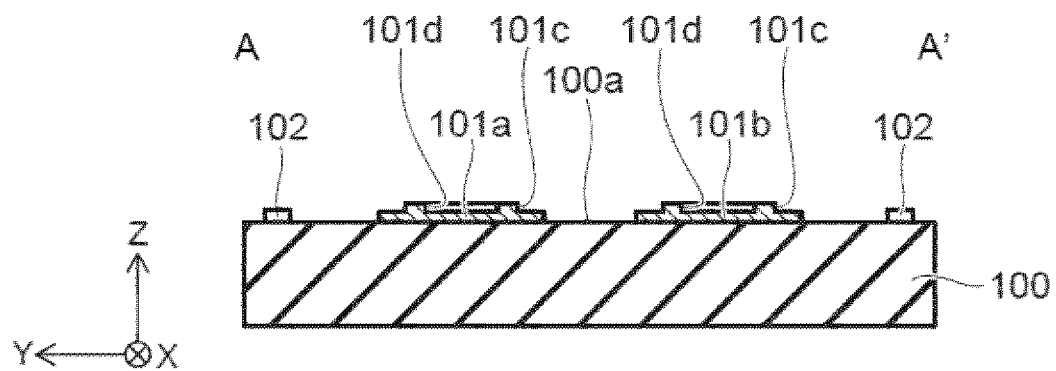
FIG. 14B is a schematic cross-sectional view taken along line A-A' shown in FIG. 14A.

Next, variations of the above embodiments will be described. FIG. 14A is a schematic plan view for illustrating a method for manufacturing a light emitting device according to this variation, and FIG. 14B is a schematic cross-sectional view taken along line A-A' shown in FIG. 14A. The step shown in FIG. 14A and FIG. 14B corresponds to the step of the embodiment described above shown in FIG. 1A and FIG. 1B.

As shown in FIG. 14A and FIG. 14B, in this variation, a depression 101d is formed in the upper surface of the protruding portion 101c of each of the metal layers 101a and 101b of the substrate 100. Thus, even if an excessive amount of the bonding member 103 is applied to the protruding portions 101c of the metal layers 101a and 101b, the excess of the bonding member 103 can move into the depressions 101d. Thus, for example, it is possible to reduce the amount of the bonding member 103 located around the electrodes 12a and 12b of the light emitting element 10, and to reduce the amount of the bonding member 103 to be exposed after the substrate 100 is removed. As a result, steps such as the laser abrasion of selectively removing the conductive film 25 can be made easier. Otherwise, the manufacturing method, the configuration and the effects of this variation are as described in the embodiment above.

Figure 15A:
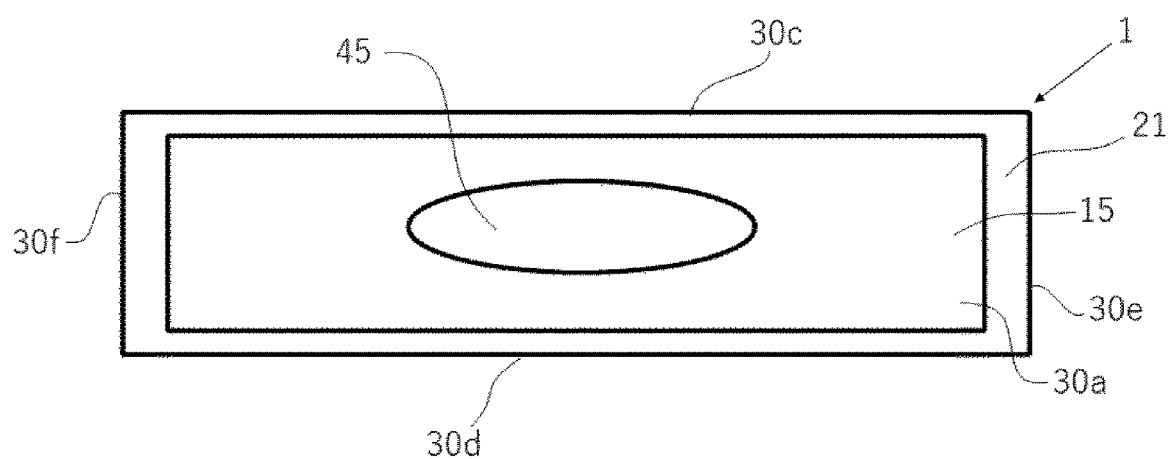
FIG. 15A is a schematic plan view showing a light emitting device according to a variation.

As shown in FIG. 15A, a reflective material 45 containing a light reflective substance may be arranged on the light exit surface 30a of the light emitting device 1. The reflective material 45 is arranged on the light exit surface 30a located directly above the light emitting element 10, for example. By arranging the reflective material 45 containing a light reflective substance on the region of the light exit surface 30a directly above the light emitting element 10 with which having the highest optical output power, it is possible to reduce the output power of light to be emitted directly above the light emitting element 10, and it is easier to even out the output power of light to be emitted from the entire light exit surface 30a of the light emitting device 1.

Figure 15B:
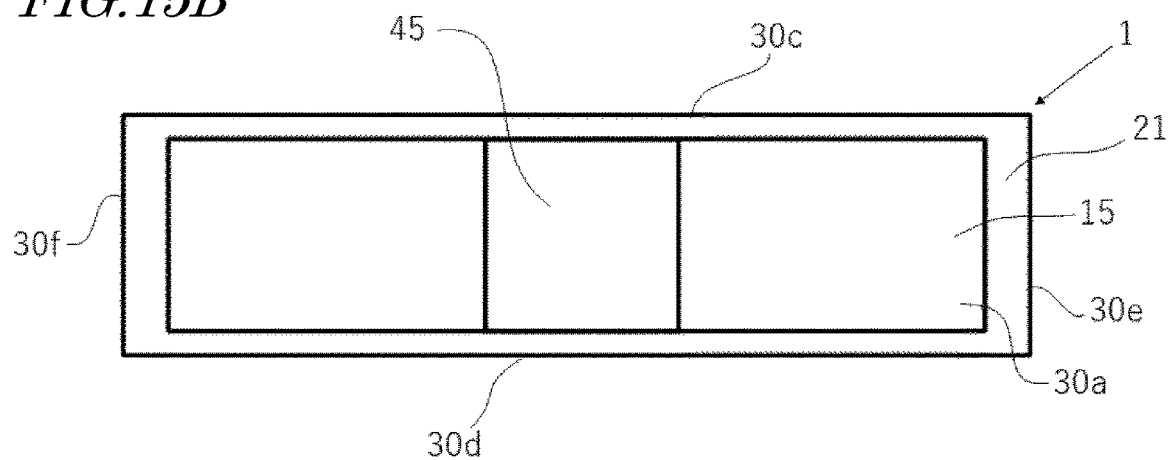
FIG. 15B is a schematic plan view showing a light emitting device according to a variation.

The content of the light reflective substance with respect to the entire reflective material 45 is, for example, 5 wt % to 75 wt %, and preferably 8 wt % to 65 wt %. The light emitting device 1 may include, on the light exit surface 30a, only one layer of the reflective material 45 or a plurality of layers of the reflective material 45.

Where the light exit surface 30a of the light emitting device 1 has the longitudinal direction and the width direction, the planar shape of the reflective material 45 is preferably elongated in the longitudinal direction as shown in FIG. 15A. Then, it is easier to even out the output power of light to be emitted from the entire light exit surface 30a of the light emitting device 1. The planar shape of the reflective material 45 may be arranged so as to be aligned with a pair of opposing sides of the light exit surface 30a as shown in FIG. 15B. Thus, it is possible to further increase the output power of light to be emitted in the longitudinal direction with respect to the output power of light to be emitted in the width direction. Note that the planar shape of the reflective material 45 may be any of various shapes.

The embodiments of the present disclosure can be used, for example, as the light source of a display device, etc.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for manufacturing a light emitting device, the method comprising steps of:
providing an intermediate structure comprising a plurality of layered structures arranged in a first direction in a light reflecting member, the plurality of layered structures including a first layered structure and a second layered structure adjacent to the first layered structure, wherein each of the layered structures comprises:
a first electrode and a second electrode arranged in this order in a second direction orthogonal to the first direction,
a semiconductor layered structure connected to the first electrode and the second electrode, and
a light transmissive member located on or above the semiconductor layered structure, and wherein the intermediate structure has a first surface at which the first electrode and the second electrode are exposed from the light reflecting member;
forming, on the first surface, a first hole in the light reflecting member between the first electrode of the first layered structure and the first electrode of the second layered structure as viewed in the second direction;
forming, on the first surface, a second hole in the light reflecting member between the second electrode of the first layered structure and the second electrode of the second layered structure as viewed in the second direction;
forming a conductive film on surfaces of the first electrode and the second electrode of the first layered structure and the second layered structure that are exposed from the first surface of the intermediate structure, and in the first hole and the second hole; and
severing the light reflecting member and the conductive film at positions that pass through the first hole and the second hole.

2. The method for manufacturing a light emitting device according to claim 1, wherein:
in the step of forming the first hole and the step of forming the second hole, the first hole and the second hole are open at the first surface and not open at a second surface that is on an opposite side from the first surface.

3. The method for manufacturing a light emitting device according to claim 1, wherein:
in the step of forming the first hole and the step of the second hole, the first hole and the second hole are open at the first surface and on a second surface that is on an opposite side from the first surface.

4. The method for manufacturing a light emitting device according to claim 1, wherein:
the step of forming the conductive film comprises steps of:
forming a metal film on the first surface to continuously cover the exposed surfaces of the first electrode and the second electrode and the light reflecting member, and
irradiating the metal film with laser light and removing a portion of the metal film to form conductive films that are spaced apart from each other.

5. The method for manufacturing a light emitting device according to claim 2, wherein:
the step of forming the conductive film comprises steps of:
forming a metal film on the first surface to continuously cover the exposed surfaces of the first electrode and the second electrode and the light reflecting member, and
irradiating the metal film with laser light and removing a portion of the metal film to form conductive films that are spaced apart from each other.

6. The method for manufacturing a light emitting device according to claim 3, wherein:
the step of forming the conductive film comprises steps of:
forming a metal film on the first surface to continuously cover the exposed surfaces of the first electrode and the second electrode and the light reflecting member, and
irradiating the metal film with laser light and removing a portion of the metal film to form conductive films that are spaced apart from each other.

7. The method for manufacturing a light emitting device according to claim 1, wherein:
the step of severing the light reflecting member and the conductive film comprises steps of:
severing along a pair of first imaginary severing lines that are parallel to the first direction, and
severing along a pair of second imaginary severing lines that are parallel to the second direction;
a first of the pair of first imaginary severing lines passes through the first hole and a second of the pair of first imaginary severing lines passes through the second hole; and
a first of the pair of second imaginary severing lines passes through both of the first hole and the second hole.

8. The method for manufacturing a light emitting device according to claim 2, wherein:
the step of severing the light reflecting member and the conductive film comprises steps of:
severing along a pair of first imaginary severing lines that are parallel to the first direction, and
severing along a pair of second imaginary severing lines that are parallel to the second direction;
a first of the pair of first imaginary severing lines passes through the first hole and a second of the pair of first imaginary severing lines passes through the second hole; and
a first of the pair of second imaginary severing lines passes through both of the first hole and the second hole.

9. The method for manufacturing a light emitting device according to claim 3, wherein:
the step of severing the light reflecting member and the conductive film comprises steps of:
severing along a pair of first imaginary severing lines that are parallel to the first direction, and
severing along a pair of second imaginary severing lines that are parallel to the second direction;
a first of the pair of first imaginary severing lines passes through the first hole and a second of the pair of first imaginary severing lines passes through the second hole; and
a first of the pair of second imaginary severing lines passes through both of the first hole and the second hole.

10. The method for manufacturing a light emitting device according to claim 4, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of first imaginary severing lines passes through the first hole and a second of the pair of first imaginary severing lines passes through the second hole; and
a first of the pair of second imaginary severing lines passes through both of the first hole and the second hole.

11. The method for manufacturing a light emitting device according to claim 5, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of first imaginary severing lines passes through the first hole and a second of the pair of first imaginary severing lines passes through the second hole; and
a first of the pair of second imaginary severing lines passes through both of the first hole and the second hole.

12. The method for manufacturing a light emitting device according to claim 6, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of first imaginary severing lines passes through the first hole and a second of the pair of first imaginary severing lines passes through the second hole; and
a first of the pair of second imaginary severing lines passes through both of the first hole and the second hole.

13. The method for manufacturing a light emitting device according to claim 1, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

14. The method for manufacturing a light emitting device according to claim 2, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

15. The method for manufacturing a light emitting device according to claim 3, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

16. The method for manufacturing a light emitting device according to claim 4, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

17. The method for manufacturing a light emitting device according to claim 5, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

18. The method for manufacturing a light emitting device according to claim 6, wherein:
the step of severing the light reflecting member and the conductive film comprises steps of:
severing along a pair of first imaginary severing lines that are parallel to the first direction, and
severing along a pair of second imaginary severing lines that are parallel to the second direction; and
a first of the pair of second imaginary severing lines passes through both of the first hole and the second hole, and the pair of first imaginary severing lines pass through neither of the first hole and the second hole.

19. The method for manufacturing a light emitting device according to claim 1, wherein widths of the first hole and the second hole are larger than widths of the first electrode and the second electrode, respectively, in the first direction.

20. The method for manufacturing a light emitting device according to claim 2, wherein widths of the first hole and the second hole are larger than widths of the first electrode and the second electrode, respectively, in the first direction.

* * * * *